United States Patent
Jeong et al.

(10) Patent No.: US 11,588,057 B2
(45) Date of Patent: Feb. 21, 2023

(54) THIN FILM TRANSISTOR AND VERTICAL NON-VOLATILE MEMORY DEVICE INCLUDING METAL OXIDE CHANNEL LAYER HAVING BIXBYITE CRYSTAL

(71) Applicant: Industry-University Cooperation Foundation Hanyang University, Seoul (KR)

(72) Inventors: Jae Kyeong Jeong, Seoul (KR); Hyun Ji Yang, Seoul (KR); Hyeon Joo Seul, Incheon (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 189 days.

(21) Appl. No.: 16/759,948

(22) PCT Filed: Apr. 22, 2020

(86) PCT No.: PCT/KR2020/005335
§ 371 (c)(1),
(2) Date: Apr. 28, 2020

(87) PCT Pub. No.: WO2021/040183
PCT Pub. Date: Mar. 4, 2021

(65) Prior Publication Data
US 2021/0408290 A1    Dec. 30, 2021

(30) Foreign Application Priority Data

Aug. 28, 2019    (KR) .................. 10-2019-0105940

(51) Int. Cl.
*H01L 29/786*    (2006.01)
*H01L 29/04*    (2006.01)
(Continued)

(52) U.S. Cl.
CPC .... *H01L 29/7869* (2013.01); *H01L 21/02595* (2013.01); *H01L 21/823412* (2013.01);
(Continued)

(58) Field of Classification Search
CPC ........ H01L 21/02472; H01L 21/02483; H01L 21/02565; H01L 21/02595; H01L 21/8232;
(Continued)

(56) References Cited

U.S. PATENT DOCUMENTS

| 10,388,661 B2 | 8/2019 | Park et al. |
| 2014/0239291 A1 | 8/2014 | Son et al. |
| 2019/0393353 A1* | 12/2019 | Jeong ................ H01L 29/66969 |

FOREIGN PATENT DOCUMENTS

| KR | 10-2018-0071017 A | 6/2018 |
| KR | 10-2019-0088492 A | 7/2019 |
| WO | 2018/100465 A1 | 6/2018 |

OTHER PUBLICATIONS

Kazuaki Ebata et al., "Polycrystalline In—Ga—O Semiconductor for High-Performance Thin-Film Transistor", 2012, 19th International Workshop on Active-Matrix Flatpanel Displays and Devices (AM-FPD '12), pp. 9-12 (5 pages total).
(Continued)

*Primary Examiner* — Cheung Lee
(74) *Attorney, Agent, or Firm* — Sughrue Mion, PLLC

(57) ABSTRACT

A thin film transistor and a non-volatile memory device are provided. The thin film transistor comprises a gate electrode, and a metal oxide channel layer traversing the upper or lower portions of the gate electrode. The metal oxide channel layer has semiconductor properties while having bixbyite crystals. An insulating layer is disposed between the gate electrode and the metal oxide channel layer. Source and
(Continued)

drain electrodes are electrically connected to both ends of the metal oxide channel layer, respectively.

12 Claims, 23 Drawing Sheets

(51) Int. Cl.
*H01L 29/10* (2006.01)
*H01L 29/66* (2006.01)
*H01L 21/02* (2006.01)
*H01L 21/8234* (2006.01)

(52) U.S. Cl.
CPC ...... *H01L 21/823487* (2013.01); *H01L 29/04* (2013.01); *H01L 29/1037* (2013.01); *H01L 29/6675* (2013.01); *H01L 29/66742* (2013.01)

(58) Field of Classification Search
CPC ..... H01L 21/823412; H01L 21/823418; H01L 21/823437; H01L 21/823487; H01L 21/8238; H01L 21/823807; H01L 21/823814; H01L 21/823828; H01L 21/823885; H01L 29/04; H01L 29/045; H01L 29/1025; H01L 29/1037; H01L 29/66742; H01L 29/6675; H01L 29/786; H01L 29/78672; H01L 29/7869
See application file for complete search history.

(56) References Cited

OTHER PUBLICATIONS

Eunjin Bae et al., "A Study on Indium Gallium Oxide Thin Film Transistors prepared by a Solution-based Deposition Method", Korean Chemical Engineering Research, vol. 49, No. 5. pp 600-604, Oct. 2011 (6 pages total).

Hyun Ji Yang et al., "Improved performance of Indium-Gallium-Oxide thin film transistors fabricated by atomic layer deposition", 2019, Korean Society of Materials Science and Technology Spring Conference, pp. 167-168, May 15, 2019 (2 pages total).

Translation of International Search Report dated Jul. 28, 2020 from the International Searching Authority in International Application No. PCT/KR2020/005335.

Written Opinion dated Jul. 28, 2020 from the International Searching Authority in International Application No. PCT/KR2020/005335.

* cited by examiner

THIN FILM TRANSISTOR AND VERTICAL NON-VOLATILE MEMORY DEVICE INCLUDING METAL OXIDE CHANNEL LAYER HAVING BIXBYITE CRYSTAL

CROSS REFERENCE TO RELATED APPLICATIONS

This application is a National Stage of International Application No. PCT/KR2020/005335 filed Apr. 22, 2020, claiming priority based on Korean Patent Application No. 10-2019-0105940 filed Aug. 28, 2019.

TECHNICAL FIELD

The present invention relates to a semiconductor device, and more particularly, to a transistor having an oxide semiconductor layer.

BACKGROUND ART

As a silicon film used as a semiconductor film of a transistor, an amorphous silicon film or a polycrystalline silicon film is used depending on applications. For example, in the case of a transistor included in a large-sized display device, it is preferable to use an amorphous silicon film that can have relatively uniform characteristics even though it is formed in a large area. On the other hand, in the case of a device including a driving circuit or the like, it is preferable to use a polycrystalline silicon film capable of exhibiting high field-effect mobility. As a method for forming the polycrystalline silicon film, methods are known in which an amorphous silicon film is subjected to high-temperature heat treatment or laser light treatment.

Recently, research is being conducted using an oxide semiconductor as a channel layer of a transistor (JP Publication 2006-165528). However, most of the oxide semiconductor layer is an amorphous layer, and is known to be electrically and chemically unstable, and it is known that it is difficult to exhibit sufficient field-effect mobility.

DISCLOSURE

Technical Problem

The problem to be solved by the present invention is to provide a thin film transistor and a vertical nonvolatile memory device having a polycrystalline oxide semiconductor thin film exhibiting high field-effect mobility.

The technical problems of the present invention are not limited to the technical problems mentioned above, and other technical problems not mentioned will be clearly understood by those skilled in the art from the following description.

Technical Solution

One aspect of the present invention provides a thin film transistor. The thin film transistor includes a gate electrode, and a metal oxide channel layer traversing the upper or lower portions of the gate electrode. The metal oxide channel layer has semiconductor properties while having bixbyite crystals. An insulating layer is disposed between the gate electrode and the metal oxide channel layer. Source and drain electrodes are electrically connected to both ends of the metal oxide channel layer, respectively.

The metal oxide channel layer may have bixbyite grains. In this case, the metal oxide channel layer may show a (400) diffraction peak as well as a (222) diffraction peak on an XRD spectrum. As another example, the metal oxide channel layer may have a pseudo-single crystal in which bixbyite crystal is preferentially oriented. In this case, the metal oxide channel layer may show a (222) diffraction peak without a (400) diffraction peak on an XRD spectrum. The metal oxide channel layer may be an In—Ga oxide (IGO) layer having a content of 60 to 90 at % of In compared to the total number of atoms of In and Ga. Further, the metal oxide channel layer may be an In—Ga oxide (IGO) layer having a content of 63 to 70 at % of In compared to the total number of atoms of In and Ga.

Another aspect of the present invention provides a vertical non-volatile memory device. The device comprises a substrate and an insulating pillar extending in an upper direction of the substrate. Interlayer insulating layers and control gate patterns are disposed on the side of the insulating pillar and alternately stacked. A metal oxide channel layer is disposed on the insulating pillar and extending along the insulating pillar between the insulating pillar and the control gate patterns. The metal oxide channel layer has semiconductor properties while having bixbyite crystals. A tunnel insulating layer, a charge trap layer, and a blocking insulating layer are sequentially disposed between the metal oxide channel layer and the control gate patterns.

The metal oxide channel layer may be polycrystalline with bixbyite grains or may be a pseudo-single crystal in which bixbyite crystal is preferentially oriented. The metal oxide channel layer may be polycrystalline with a (400) diffraction peak as well as a (222) diffraction peak or may be a pseudo-single crystal with a (222) diffraction peak without a (400) diffraction peak on an XRD spectrum.

The metal oxide channel layer may be an In—Ga oxide (IGO) layer having a content of 60 to 90 at % of In compared to the total number of atoms of In and Ga. The metal oxide channel layer may be an In—Ga oxide (IGO) layer having a content of 63 to 70 at % of In compared to the total number of atoms of In and Ga.

Another aspect of the present invention provides a method for fabricating a thin film transistor. The method comprises forming the thin film transistor including a gate electrode, a metal oxide channel layer traversing the upper or lower portions of the gate electrode, an insulating layer disposed between the gate electrode and the metal oxide channel layer, and source and drain electrodes electrically connected to both ends of the metal oxide channel layer, respectively. The metal oxide channel layer is formed to contain In at about 60 to 90 at % of the total number of atoms of In and Ga, and is subjected to post-deposition annealing (PDA) at a temperature of 300 to 800° C.

The metal oxide channel layer may have semiconductor properties while having bixbyite crystals. The metal oxide channel layer may be formed to contain In at about 63 to 70 at % of the total number of atoms of In and Ga, and may be subjected to post-deposition annealing at a temperature of 500 to 800° C. In this case, the metal oxide channel layer may be formed to have a pseudo-single crystal in which bixbyite crystal is preferentially oriented. As another example, the metal oxide channel layer may be formed to contain In at about 71 to 85 at % of the total number of atoms of In and Ga, and may be subjected to post-deposition annealing at a temperature of 300 to 500° C. In this case, the metal oxide channel layer may be formed to be polycrystalline with bixbyite grains.

Advantageous Effects

According to the present invention described above, a vertical nonvolatile memory device and a thin film transistor having a crystalline oxide semiconductor thin film exhibiting high field-effect mobility can be provided.

However, the effects of the present invention are not limited to the above-mentioned effects, and other effects not mentioned will be clearly understood by those skilled in the art from the following description.

MODES OF THE INVENTION

Figure 1:
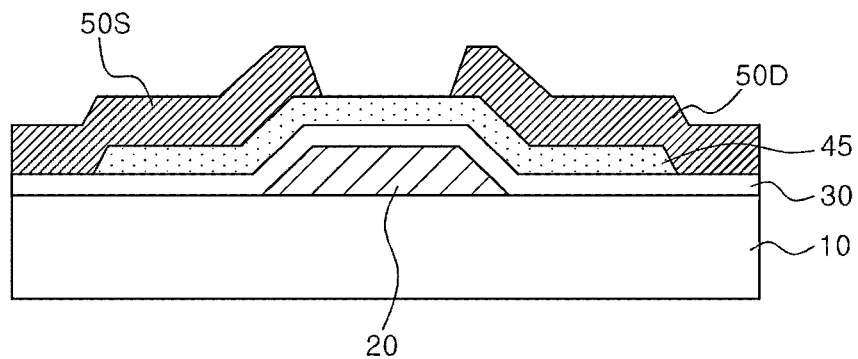
FIG. 1 is a cross-sectional view showing a thin film transistor according to an embodiment of the present invention.

Hereinafter, preferred embodiments of the present invention will be described in more detail with reference to the accompanying drawings in order to describe the present invention in more detail. However, the present invention is not limited to the embodiments described herein and may be embodied in other forms. In the drawings, when a layer is said to be "on" another layer or substrate, it may be formed directly on another layer or substrate, or a third layer may be interposed between them. In this embodiment, "first", "second", or "third" is not intended to impose any limitation on the components, but should be understood as terms for distinguishing the components.

FIG. 1 is a cross-sectional view showing a thin film transistor according to an embodiment of the present invention.

Referring to FIG. 1, a substrate 10 may be provided. The substrate 10 may be a semiconductor, metal, glass or polymer substrate. A gate electrode 20 extending in one direction may be formed on the substrate 10. The gate electrode 20 may be formed of Al, Cr, Cu, Ta, Ti, Mo, W, or alloys thereof. A gate insulating layer 30 may be formed on the gate electrode 20. The gate insulating layer 30 may be a silicon oxide film, a silicon oxynitride film, an aluminum oxide film, an aluminum oxynitride film, or a composite film thereof.

A metal oxide channel layer 45 patterned to cross the upper portion of the gate electrode 20 may be formed on the gate insulating layer 30. For example, the metal oxide channel layer 45 may be an In—Ga oxide layer, and may be in an amorphous state as deposited. The metal oxide channel layer 45 may be formed using a physical vapor deposition method such as sputtering, or a chemical deposition method such as a chemical vapor deposition method or an atomic layer deposition method as an example of various methods used in the art, and can be patterned using various methods used in the art. The metal oxide channel layer 45 may have a thickness of several to several tens of nm, specifically, 5 to 50 nm, for example, 10 to 30 nm.

Specifically, the metal oxide channel layer 45 may be formed using an atomic layer deposition method using an In source, an oxidizing agent, and a Ga source. For example, trimethyl indium (TMIn) (In(CH$_3$)$_3$) may be used as the In source, and trimethyl gallium (TMGa) (Ga(CH$_3$)$_3$) may be used as the Ga source, and at least one of oxygen (O$_2$), ozone (O$_3$), water vapor (H$_2$O), N$_2$O, and CO$_2$ may be used as the oxidizing agent. When the metal oxide channel layer 45 is formed using an atomic layer deposition method, the temperature in the chamber may be about 150 to 250° C. In addition, when the metal oxide channel layer 45 is formed using an atomic layer deposition method, the layer can have high density and excellent film quality and the ratio of each metal can be easily controlled by adjusting the injection time and the number of injection times of the metal sources.

A source electrode 50S and a drain electrode 50D may be formed on both ends of the metal oxide channel layer 45. Accordingly, a part of the surface of the metal oxide channel layer 45 between the source electrode 50S and the drain electrode 50D, specifically, a region where the metal oxide channel layer 45 overlaps with the gate electrode 20 can be exposed. The source electrode 50S and the drain electrode 50D may formed using at least one metal among aluminum (Al), neodymium (Nd), silver (Ag), chromium (Cr), titanium (Ti), tantalum (Ta), and molybdenum (Mo), or an alloy containing at least one of them, or a metal oxide conductive film such as ITO (Indium Tin Oxide).

The substrate on which the source/drain electrodes 50S and 50D are formed may be subjected to post-deposition annealing (PDA). The post-deposition annealing may be performed at a temperature of about 300 to 800° C. for example, about 400 to 750° C., specifically 500 to 750° C. in air atmosphere. In this case, the metal oxide channel layer 45 may have improved conductivity from a state close to an insulator to a state of a semiconductor, and bixbyite crystals with {111} crystal faces can be produced in the metal oxide channel layer 45; however, it may vary depending on the content ratio of In. At the same time, an ohmic contact may be formed between the source/drain electrodes 50S and 50D and the metal oxide channel layer 45.

When the metal oxide channel layer 45 is an In—Ga oxide layer (IGO), in compared to the total number of atoms of In and Ga, In may be about 60 to 90 at %, for example, about 63 to 85 at %, about 66 to 82 at %. Within this range, In—Ga oxide (IGO) may exhibit semiconductor properties while generating bixbyite crystals during the post-deposition annealing process. It is known that bixbyite crystals appear in the composition of $In_2O_3$, and $In_2O_3$ is a conductor rather than a semiconductor. However, the present embodiment discloses a metal oxide channel layer 45 having bixbyite crystals and exhibiting semiconducting properties, and furthermore, a metal oxide channel layer 45 having bixbyite crystals while being an oxide alloy of In and Ga.

Furthermore, when the metal oxide channel layer 45 is an In—Ga oxide layer (IGO), in compared to the total number of atoms of In and Ga, In may be about 60 to 70 at %, for example, about 63 to 69 at %, specifically about 65 to 67 at %. When the In—Ga oxide (IGO) in this composition range undergoes the post-deposition annealing at a temperature of about 500 to 800° C., for example 700° C., bixbyite crystals having a preferentially oriented {111} crystal plane can be grown, and thus a pseudo-single crystalline structure can be formed, resulting in very high electron mobility. Meanwhile, when the metal oxide channel layer 45 is an In—Ga oxide layer (IGO), in compared to the total number of atoms of In and Ga, In may be about 71 to 90 at %, for example, about 73 to 85 at %, specifically about 75 to 82 at %. When the In—Ga oxide (IGO) in this composition range undergoes the post-deposition annealing at a temperature of about 300 to 500° C., for example 400° C., a plurality of bixbyite grains having a {111} crystal plane can be formed, resulting in a relatively high electron mobility.

As such, the crystallized metal oxide channel layer 45, that is, the In—Ga oxide (IGO) may be a poly-crystalline having bixbyite grains or a pseudo-single crystalline having preferentially oriented bixbyite crystals. Specifically, in the crystallized metal oxide channel layer 45, a (222) diffraction peak, which is one of {111} indicating bixbyite crystal planes, can be observed near about 31° (2θ) on an XRD spectrum. Specifically, the crystallized metal oxide channel layer 45 may be polycrystalline with a (222) diffraction peak along with a (400) diffraction peak on an XRD spectrum, or may be pseudo-single crystalline with a (222) diffraction peak without a (400) diffraction peak.

Figure 2:
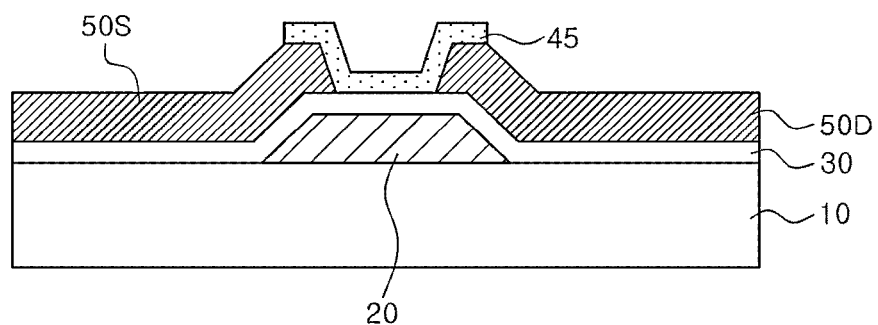
FIG. 2 is a cross-sectional view showing a method of manufacturing a thin film transistor according to another embodiment of the present invention.

FIG. 2 is a cross-sectional view showing a method of manufacturing a thin film transistor according to another embodiment of the present invention. The method of manufacturing the thin film transistor according to the present embodiment may be similar to the method of manufacturing the thin film transistor described with reference to FIG. 1 except for the following.

Referring to FIG. 2, a gate electrode 20 extending in one direction may be formed on the substrate 10, and a gate insulating layer 30 may be formed on the gate electrode 20. A source electrode 50S and a drain electrode 50D may be formed on the gate insulating layer 30. Between the source electrode 50S and the drain electrode 50D, at least a portion of the gate insulating layer 30 overlapping the gate electrode 20 may be exposed. A metal oxide channel layer 45 covering the exposed gate insulating layer 30 and a portion of the source electrode 50S and the drain electrode 50D may be formed. The substrate on which the metal oxide channel layer 45 is formed may be subjected to a post-deposition annealing (PDA). The metal oxide channel layer 45 and the post-deposition annealing may be as described with reference to FIG. 1.

Figure 3:
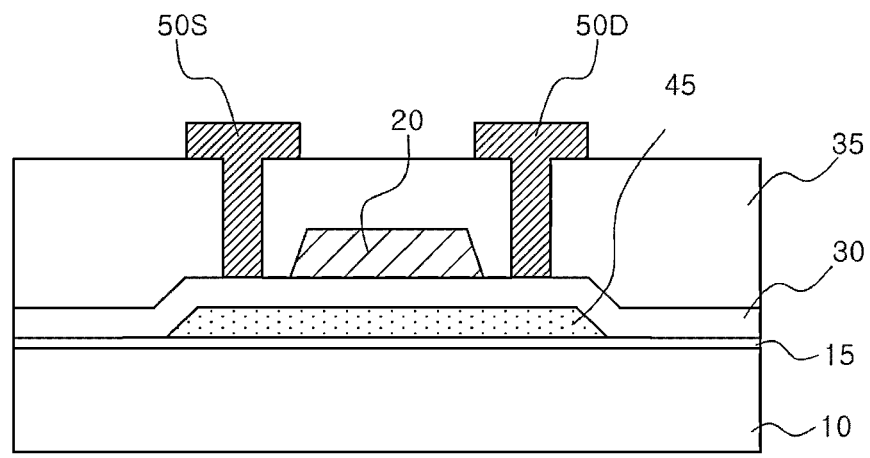
FIG. 3 is a cross-sectional view showing a method of manufacturing a thin film transistor according to another embodiment of the present invention.

FIG. 3 is a cross-sectional view showing a method of manufacturing a thin film transistor according to another embodiment of the present invention. The method of manufacturing the thin film transistor according to the present embodiment may be similar to the method of manufacturing the thin film transistor described with reference to FIG. 1 except for the following.

Referring to FIG. 3, a buffer layer 15 may be formed on a substrate 10. The buffer layer 15 may be a silicon oxide film, a silicon oxynitride film, a silicon nitride film, or a composite film of any one of them.

A metal oxide layer may be formed on the buffer layer 15 and patterned to form a patterned metal oxide channel layer 45 on the buffer layer 15. In a state in which the metal oxide layer is deposited and not patterned or in a state in which the patterned metal oxide channel layer 45 is formed, the resultant may be subjected to post-deposition annealing (PDA). The metal oxide channel layer 45 and the post-deposition annealing may be as described with reference to FIG. 1.

Thereafter, a gate insulating layer 30 may be formed on the metal oxide channel layer 45. A gate electrode 20 crossing an upper portion of the metal oxide channel layer 45 may be formed on the gate insulating layer 30. An interlayer insulating layer 35 covering the gate electrode 20 may be formed on the gate electrode 20. The interlayer insulating layer 35 may be a silicon oxide film, a silicon oxynitride film, a silicon nitride film, or a composite film of any of them.

Contact holes exposing both ends of the metal oxide channel layer 45 are formed in the interlayer insulating layer 35 and the gate insulating layer 30 below the interlayer insulating layer 35. A source electrode 50S and a drain electrode 50D, which are respectively connected to both end portions of the metal oxide channel layer 45, may be formed in the contact holes. Thereafter, a heat treatment that improves ohmic contact between the metal oxide channel layer 45 and the source/drain electrodes 50S and 50D may be performed.

FIGS. 4A to 4F are cross-sectional views illustrating a method of manufacturing a vertical nonvolatile memory device according to another embodiment of the present invention. The vertical nonvolatile memory device may be a NAND flash memory device.

Figure 4A:
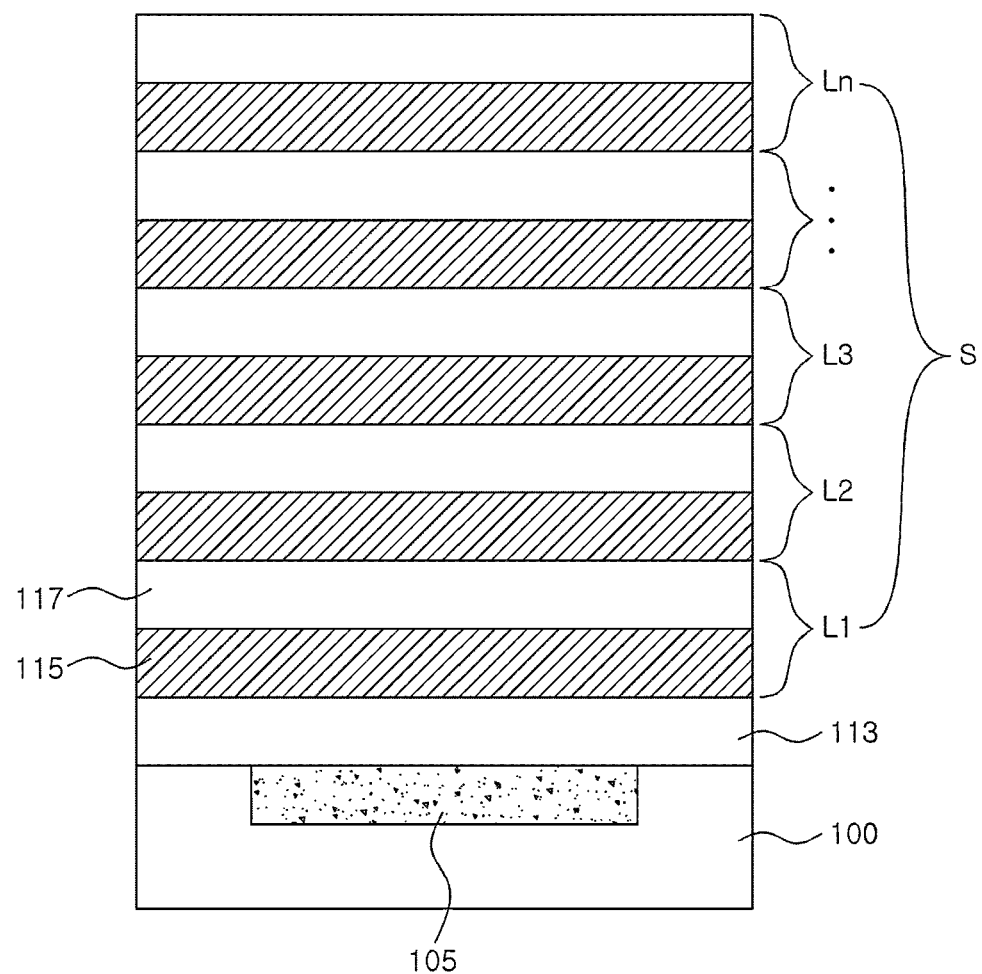
FIGS. 4A to 4F are cross-sectional views illustrating a method of manufacturing a vertical nonvolatile memory device according to another embodiment of the present invention.

Referring to FIG. 4A, a lower insulating layer 113 may be formed on a substrate 100. A stack S in which a plurality of control gate layers 115 and a plurality of interlayer insulating layers 117 are alternately stacked may be formed on the lower insulating layer 113. As an example, n pairs of the control gate layer 115 and the interlayer insulating layer 117 may be stacked to form a stack including unit layers of $L_1$, $L_2$, . . . , $L_n$. The substrate 100 may be provided with an impurity region 105 in which conductivity is improved compared to a bulk substrate because impurities are doped. The impurity region 105 may be a common source line.

The substrate 100 may be a semiconductor substrate which is a substrate made of a semiconductor, for example, monocrystalline silicon, an Iv-Iv compound such as silicon-germanium or silicon carbide, a III-V compound, or a II-VI compound, or any substrate on which any one of the semiconductors is formed. The control gate layer 115 may include a semiconductor material, for example, doped polysilicon; or a metal such as tungsten, copper, aluminum, tantalum, titanium, cobalt, titanium nitride, or an alloy of any one of them. The lower insulating layer 113 and the interlayer insulating layer 117 may be a silicon oxide layer, a silicon oxynitride layer, a silicon nitride layer, or a composite layer of any of them.

Figure 4B:
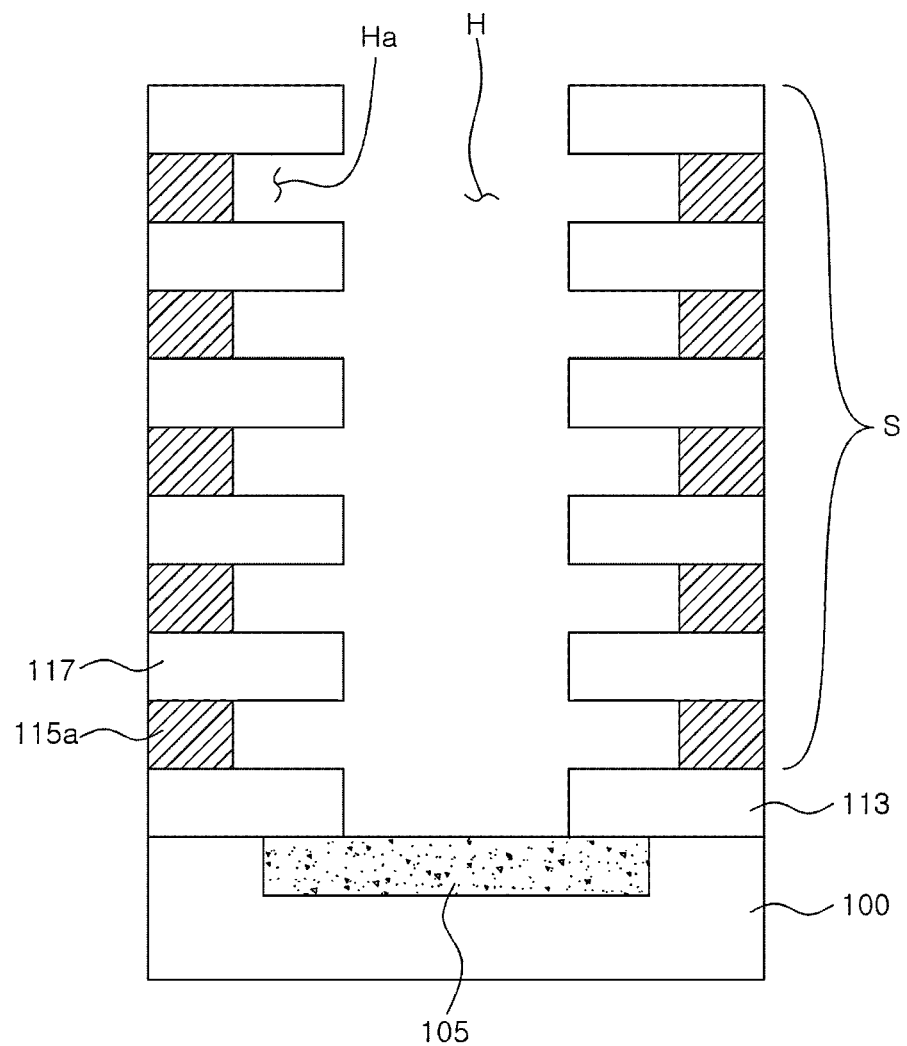

Referring to FIG. 4B, an opening H penetrating through the stack S, that is, the plurality of alternately stacked control gate layers 115 and the plurality of interlayer insulating layers 117, and the lower insulating layer 113 to expose the substrate 100, specifically the impurity region 105, may be formed.

Thereafter, the control gate layer 115 exposed in the sidewall of the opening H may be selectively recessed to form control gate patterns 115a disposed between the interlayer insulating layers 117 and at the same time, to form grooves Ha in which the control gate patterns 115a are exposed on the side portions and the insulating layers 117 and 113 are exposed in upper and lower portions.

Figure 4C:
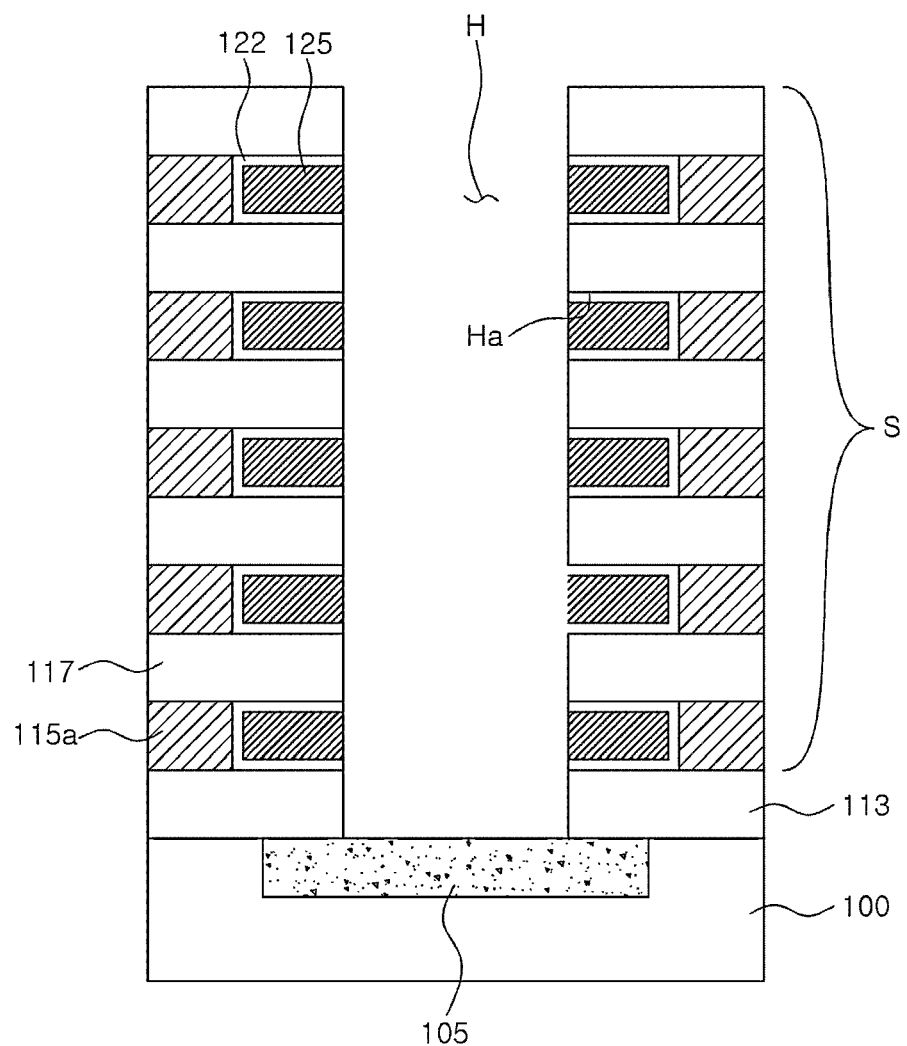

Referring to FIG. 4C, a blocking insulating layer 122 may be conformally formed on the inner surface of the grooves Ha and the sidewalls of the opening H, and a charge trap layer 125 is formed on the blocking insulating layer 122. The charge trap layer 125 and the blocking insulating layer 122 may be anisotropically etched. As a result, in the sidewall of the opening H, the insulating layers 117 and 113, the blocking insulating layer 122 conformally coating only the inner surfaces of the grooves Ha, and the charge trap layer 125 filling the grooves Ha that are surface coated with the blocking insulating layer 122 may be exposed. In this embodiment, the blocking insulating layer 122 may be referred to as an intergate dielectric (IGD), for example, a silicon oxide film, a silicon oxynitride film, or an aluminum oxide film having a high dielectric constant. In this embodiment, the charge trap layer 125 may be referred to as a floating gate, and may be, for example, polysilicon, but is not limited thereto.

Figure 4D:
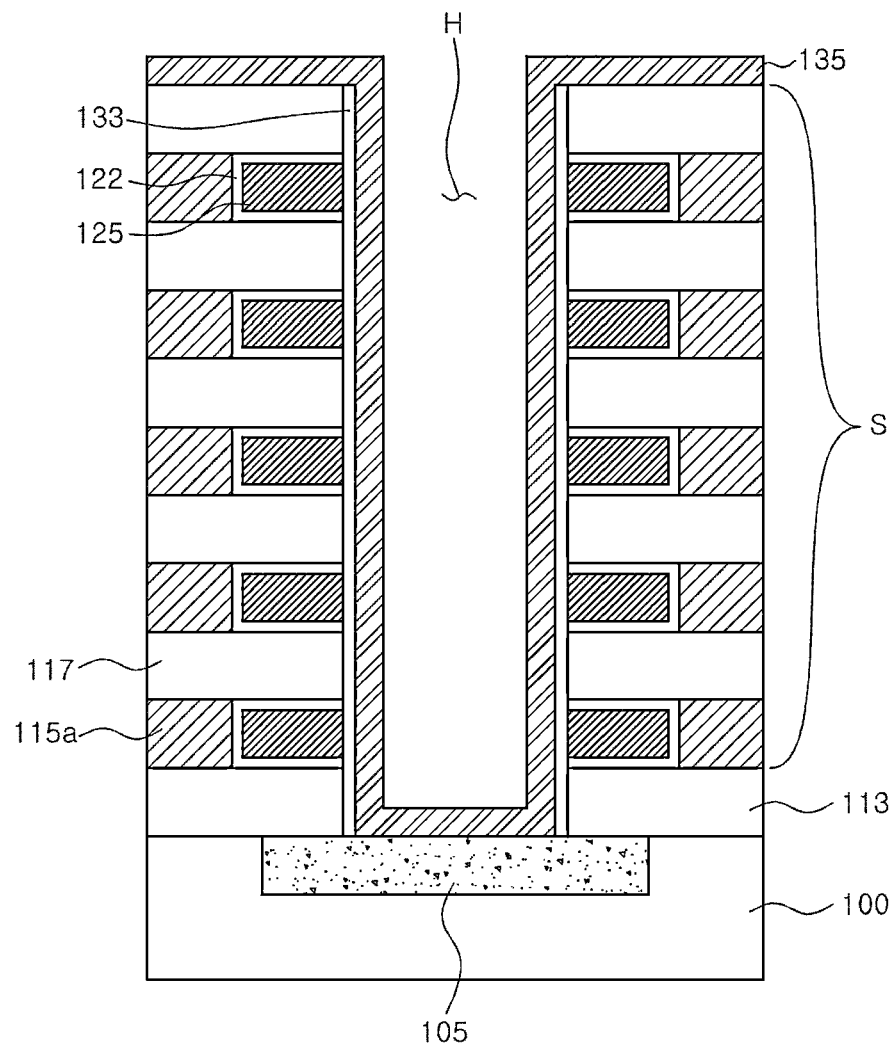

Referring to FIG. 4D, a tunnel insulating layer 133 covering the charge trap layer 125 may be formed on the sidewall of the opening H by conformally forming the tunnel insulating layer on the sidewall of the opening H as well as on the upper surface of the stack and then anisotropic etching the tunnel insulating layer. However, the present invention is not limited thereto, and the tunnel insulating layer 133 may be formed by oxidizing the charge trap layer 125 exposed on the sidewall of the opening H. The tunnel insulating layer 133 may be an aluminum oxide layer, for example, an $Al_2O_3$ film. The tunnel insulating layer 133 may be formed using an atomic layer deposition method. The tunnel insulating layer 133 may be formed to a thickness of 5 nm to 10 nm.

A metal oxide channel layer 135 may be conformally formed on the sidewall of the opening H in which the tunnel insulating layer 133 is formed and on the common source line 105. The metal oxide channel layer 135 may be, for example, an In—Ga oxide layer, and may be in an amorphous state as deposited. The metal oxide channel layer 135 may be formed using an atomic layer deposition method. Specifically, during the atomic layer deposition method for the metal oxide channel layer 135, an In source, an oxidizing agent, and a Ga source may be used. For example, trimethyl indium (TMIn) ($In(CH_3)_3$) may be used as the In source, and trimethyl gallium (TMGa) ($Ga(CH_3)_3$) may be used as the Ga source, at least one of oxygen ($O_2$), ozone ($O_3$), water vapor ($H_2O$), $N_2O$, and $CO_2$ may be used as the oxidizing agent. A chamber where the metal oxide channel layer 135 is formed using an atomic layer deposition method may be in a temperature range of about 150 to 250° C. In addition, when the metal oxide channel layer 135 is formed using an atomic layer deposition method, the ratio of each metal can be easily controlled by adjusting the injection time and the number of injection times of metal sources, and the deposited metal oxide channel layer 135 can have a high density and excellent film quality. The metal oxide channel layer 135 may be formed to a thickness of several to several tens of nm, for example, 5 to 50 nm, and more specifically 10 to 30 nm.

The substrate on which the metal oxide channel layer 135 is formed may be subjected to a post-deposition annealing (PDA). The post-deposition annealing may be performed at a temperature of about 300 to 800° C. for example, about 400 to 750° C., specifically 500 to 750° C. in air atmosphere. During the PDA, depending on the content ratio of In, the metal oxide channel layer 135 may be changed into a semiconductor from a state close to an insulator thereby improving conductivity and bixbyite crystals with {111} crystal faces in the metal oxide channel layer 135 can be produced. At the same time, an ohmic contact may be formed between the common source line 105 and the metal oxide channel layer 135.

When the metal oxide channel layer 135 is an In—Ga oxide layer (IGO), in compared to the total number of atoms of In and Ga, In may be about 60 to 90 at %, for example, about 63 to 85 at %, about 66 to 82 at %. Within this range, In—Ga oxide (IGO) may exhibit semiconductor properties while generating bixbyite crystals during the post-deposition annealing (PDA) process. It is known that bixbyite crystals appear in the composition of $In_2O_3$, and $In_2O_3$ is a conductor rather than a semiconductor. However, the present embodiment discloses a metal oxide channel layer 135 having bixbyite crystals while exhibiting semiconducting properties, and furthermore, a metal oxide channel layer 135 having bixbyite crystals while being an alloy oxide of In and Ga.

Furthermore, when the metal oxide channel layer 135 is an In—Ga oxide layer (IGO), in compared to the total number of atoms of In and Ga, In may be about 60 to 70 at %, for example, about 63 to 69 at %, specifically about 65 to 67 at %. When the In—Ga oxide (IGO) in this composition range undergoes the post-deposition annealing at a temperature of about 500 to 800° C., for example 700° C., bixbyite crystals having a preferentially oriented {111} crystal plane can be grown, and thus a pseudo-single crystalline structure can be formed, resulting in very high electron mobility. Meanwhile, when the metal oxide channel layer 135 is an In—Ga oxide layer (IGO), in compared to the total number of atoms of In and Ga, In may be about 71 to 90 at %, for example, about 73 to 85 at %, specifically about 75 to 82 at %. When the In—Ga oxide (IGO) in this composition range undergoes the post-deposition annealing at a temperature of about 300 to 500° C., for example 400° C., a plurality of bixbyite grains having a {111} crystal plane can be formed, resulting in a relatively high electron mobility.

As such, the crystallized metal oxide channel layer 135, that is, the In—Ga oxide (IGO) may be poly-crystalline having bixbyite grains or pseudo-single crystalline having preferentially oriented bixbyite crystals. Specifically, in the crystallized metal oxide channel layer 135, a (222) diffraction peak, one of {111} which means bixbyite crystal planes, can be observed near about 31° (20) on an XRD spectrum. Specifically, the crystallized metal oxide channel layer 135 may be polycrystalline with a (222) diffraction peak along with a (400) diffraction peak, or pseudo-single crystalline with a (222) diffraction peak without a (400) diffraction peak on an XRD spectrum.

Figure 4E:
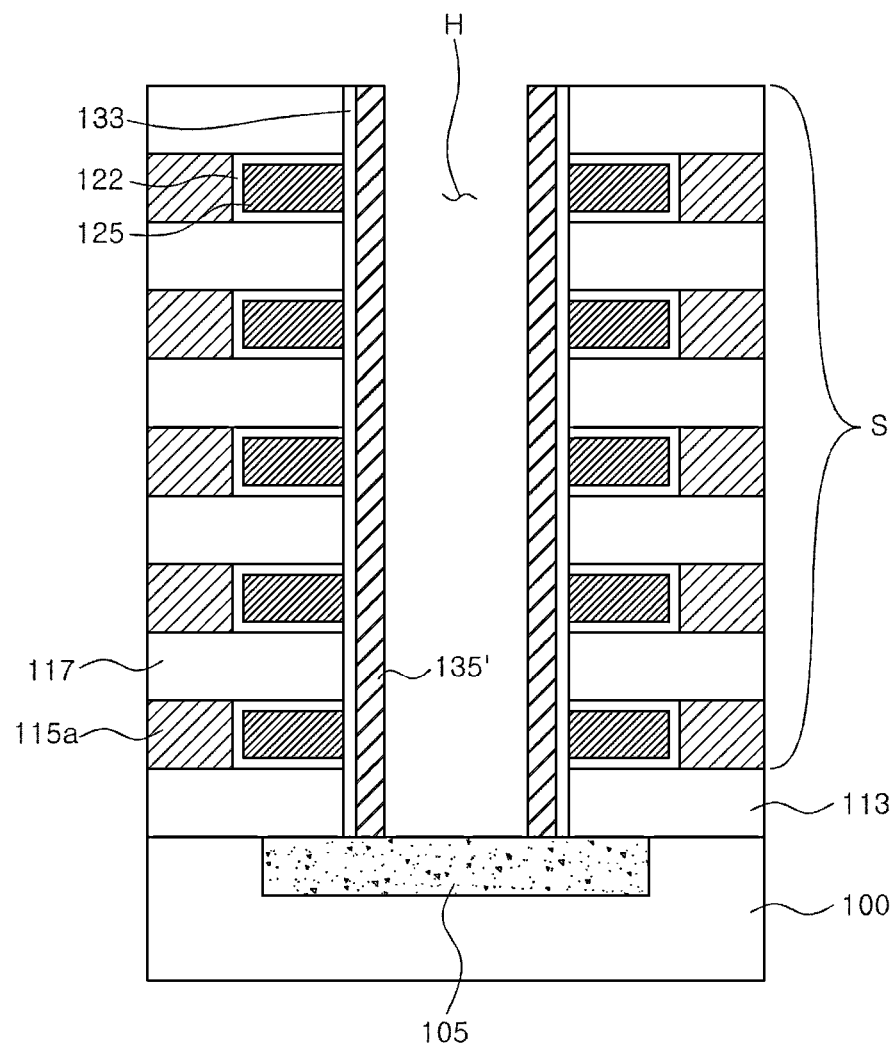

Referring to FIG. 4E, the metal oxide channel layer 135 may be anisotropically etched to form a patterned metal oxide channel layer 135' positioned on the tunnel insulating layer 133 formed on the sidewall of the opening H. At the same time, the common source line 105 may be exposed in the opening H.

Figure 4F:
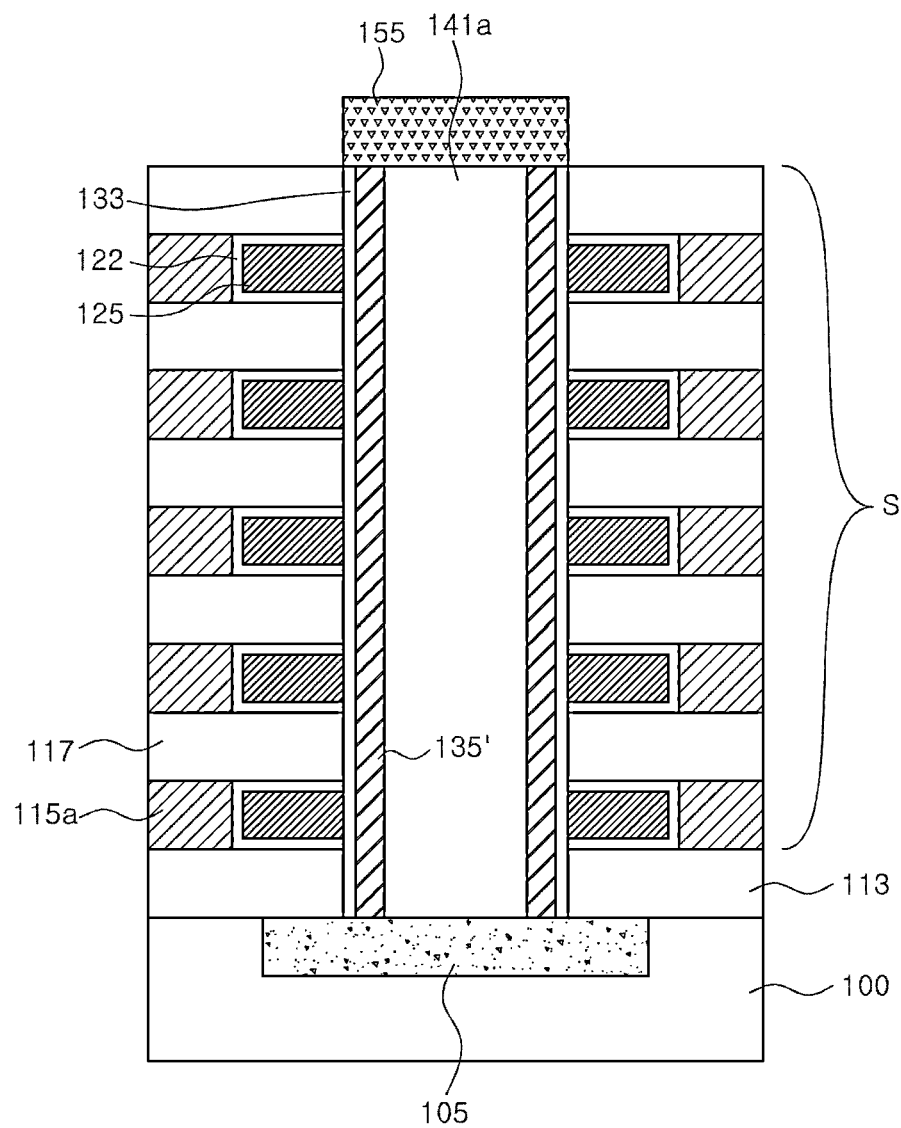

Referring to FIG. 4F, the opening H in which the metal oxide channel layer 135' is formed may be filled with a buried insulating film, and the buried insulating film may be planarization etched to expose the upper surface of the stack S to form an insulating pillar 141a, and at the same time, the upper surface of the stack S and an upper end surface of the semiconductor channel layer 135 surrounding the insulating pillar 141a may be exposed. An upper electrode 155 covering the insulating pillar 141a and the metal oxide channel layer 135' surrounding the insulating pillar 141a may be formed. The upper electrode 155 may be a bit line or a conductive pad connected to a bit line.

Referring back to FIG. 4F, the structure of the vertical non-volatile memory device according to the present embodiment will be described. The vertical non-volatile memory device according to the present exemplary embodiment may include an insulating pillar 141a extending in an upper direction of the substrate 100. Interlayer insulating layers 117 and control gate patterns 115a that are alternately stacked on the side of the insulating pillar 141a may be placed. A metal oxide channel layer 135' stacked on the insulating pillar 141a between the insulating pillar 141a and the control gate patterns 115a and extending along the insulating pillar 141a may be positioned. Specifically, the side wall of the insulating pillar 141a may be surrounded by the metal oxide channel layer 135'. The metal oxide channel layer 135' may be polycrystalline including Bixbyite crystal grains or may be pseudo-monocrystalline in which Bixbyite crystals are preferentially oriented. A tunnel insulating layer 133, a charge trap layer 125, and a blocking insulating layer 122 are sequentially disposed between the metal oxide channel layer 135' and the control gate patterns 115a. Specifically, the horizontal width parallel to the substrate surface of the control gate pattern 115a may be narrow compared to the horizontal width of the interlayer insulating films 117 located at the upper and lower portions of the control gate pattern 115a, and thereby grooves Ha of FIG. 4C exposing the interlayer insulating layers 117 on upper and lower portions and exposing the control gate on the side may be defined, and the blocking insulating layer 122 may conformally coat the inner surface of the grooves Ha, The charge trap layer 125 may fill the grooves Ha that are surface-coated with the blocking insulating layer 122. The tunnel insulating layer 133 may cover the charge trap layer 125.

FIG. 5A to 5D are cross-sectional views illustrating a method of manufacturing a vertical nonvolatile memory device according to another embodiment of the present invention. The device manufacturing method according to the present embodiment may be similar to the device manufacturing method described with reference to FIGS. 4A to 4F, except as described below.

Figure 5A:
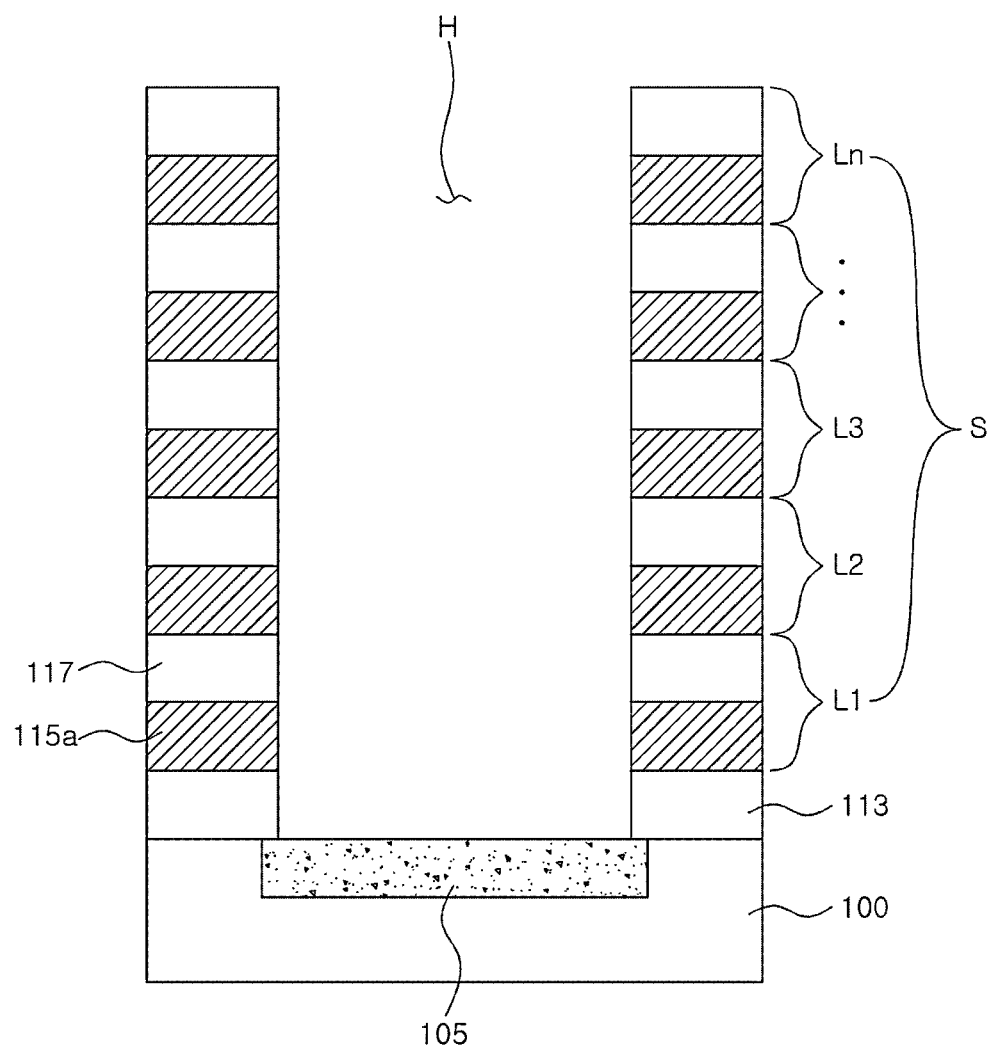
FIG. 5A to 5D are cross-sectional views illustrating a method of manufacturing a vertical nonvolatile memory device according to another embodiment of the present invention.

Referring to FIG. 5A, a lower insulating layer 113 may be formed on the substrate 100. A stack S in which a plurality of control gate layers and a plurality of interlayer insulating layers 117 are alternately stacked may be formed on the lower insulating film 113. As an example, n pairs of the control gate layer and the interlayer insulating layer 117 may be stacked to form a stack including unit layers of $L_1$, $L_2$, . . . , $L_n$. The substrate 100 may be provided with an impurity region 105 in which conductivity is improved compared to a bulk substrate by doping with impurities. The impurity region 105 may be a common source line.

An opening H penetrating through the stack S, that is, the plurality of alternately stacked control gate layers and the plurality of interlayer insulating layers 117, and the lower insulating layer 113 to expose the substrate 100, specifically the impurity region 105, may be formed. A control gate pattern 115a interposed between the insulating layers 117 and 113 may be defined by the formation of the opening H, and the control gate pattern 115a may be exposed in the sidewall of the opening H.

Figure 5B:
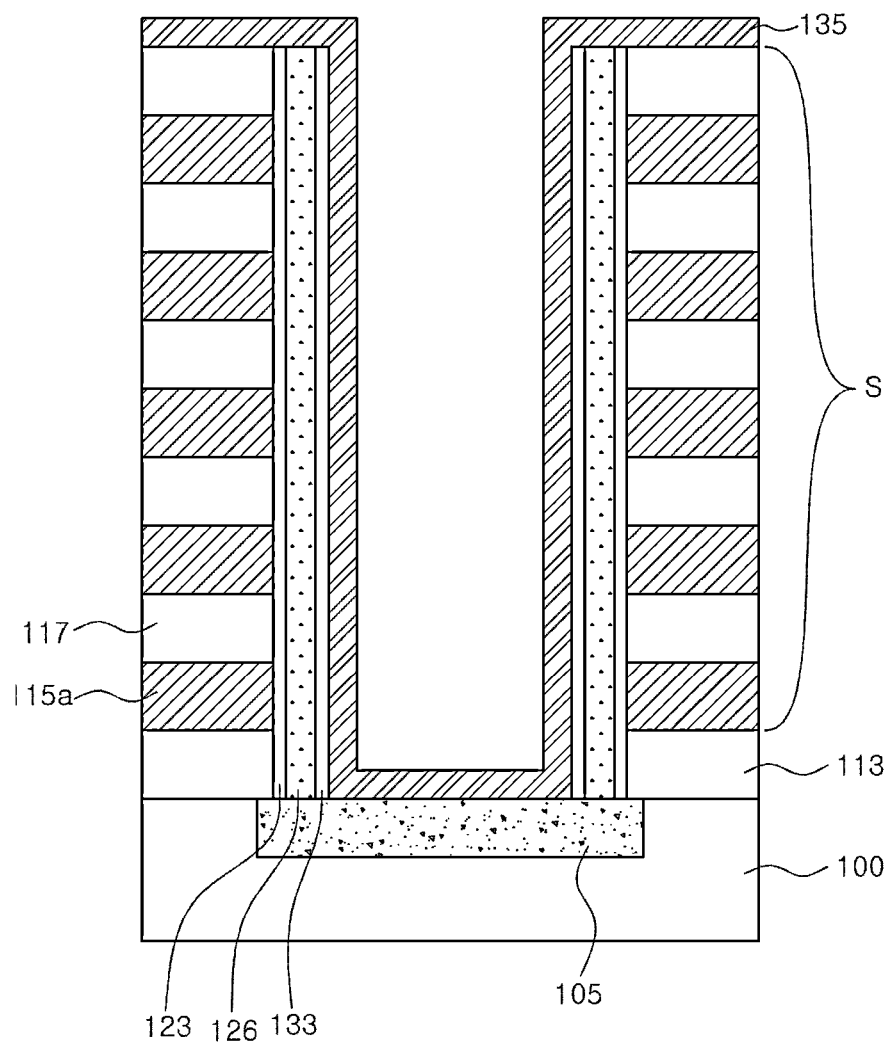

Referring to FIG. 5B, a blocking insulating layer 123, a charge trap layer 126, and a tunnel insulating layer 133 may be conformally formed along a surface profile on the substrate having the control gate pattern 115a exposed in a sidewall of the opening H. Then the tunnel insulating layer 133, the charge trap layer 126, and the blocking insulating layer 123 may be anisotropically etched. As a result, the blocking insulating layer 123, the charge trap layer 126, and the tunnel insulating layer 133 can be sequentially stacked on the sidewalls of the opening H. In this embodiment, the charge trap layer 126 may be a silicon nitride film, but is not limited thereto. The blocking insulating layer 122 may be a silicon oxide film, a silicon oxynitride film, or an aluminum oxide film having a high dielectric constant. The tunnel insulating film 133 may be an aluminum oxide layer, for example, an $Al_2O_3$ film. The tunnel insulating layer 133 may be formed using an atomic layer deposition method. The tunnel insulating layer 133 may be formed to a thickness of 5 nm to 10 nm.

A metal oxide channel layer 135 may be conformally formed on the common source line 105 and the sidewall of the opening H in which the tunnel insulating layer 133 is formed. The substrate on which the metal oxide channel layer 135 is formed may be subjected to post-deposition annealing. The metal oxide channel layer 135 and the post-deposition annealing may be as described with reference to FIG. 4D. The metal oxide channel layer 135 may be crystallized by post-deposition annealing, and thus the metal oxide channel layer 135 may be changed into a polycrystal having bixbyite grains or a pseudo-single crystal in which Bixbyite crystals are preferentially oriented.

Figure 5C:
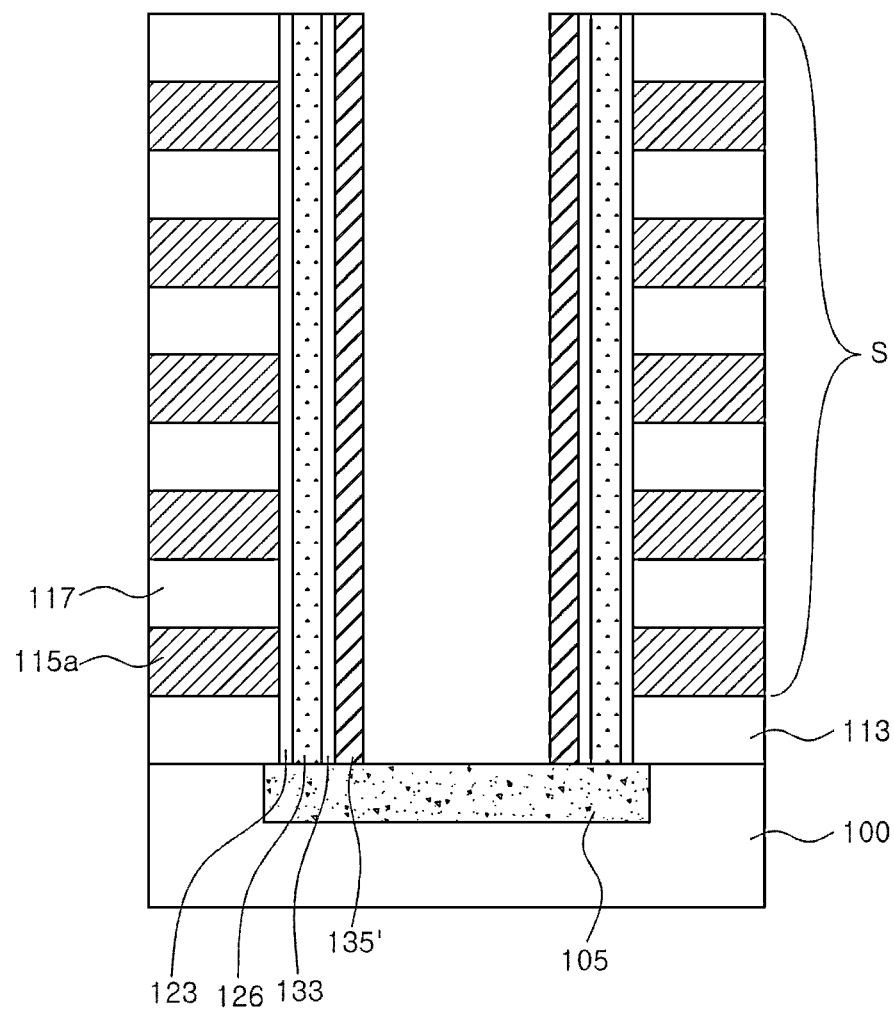

Referring to FIG. 5C, the metal oxide channel layer 135 may be anisotropically etched to form a patterned metal oxide channel layer 135' stacked on the tunnel insulating layer 133 formed on the sidewall of the opening H. At the same time, the common source line 105 may be exposed in the opening H.

Figure 5D:
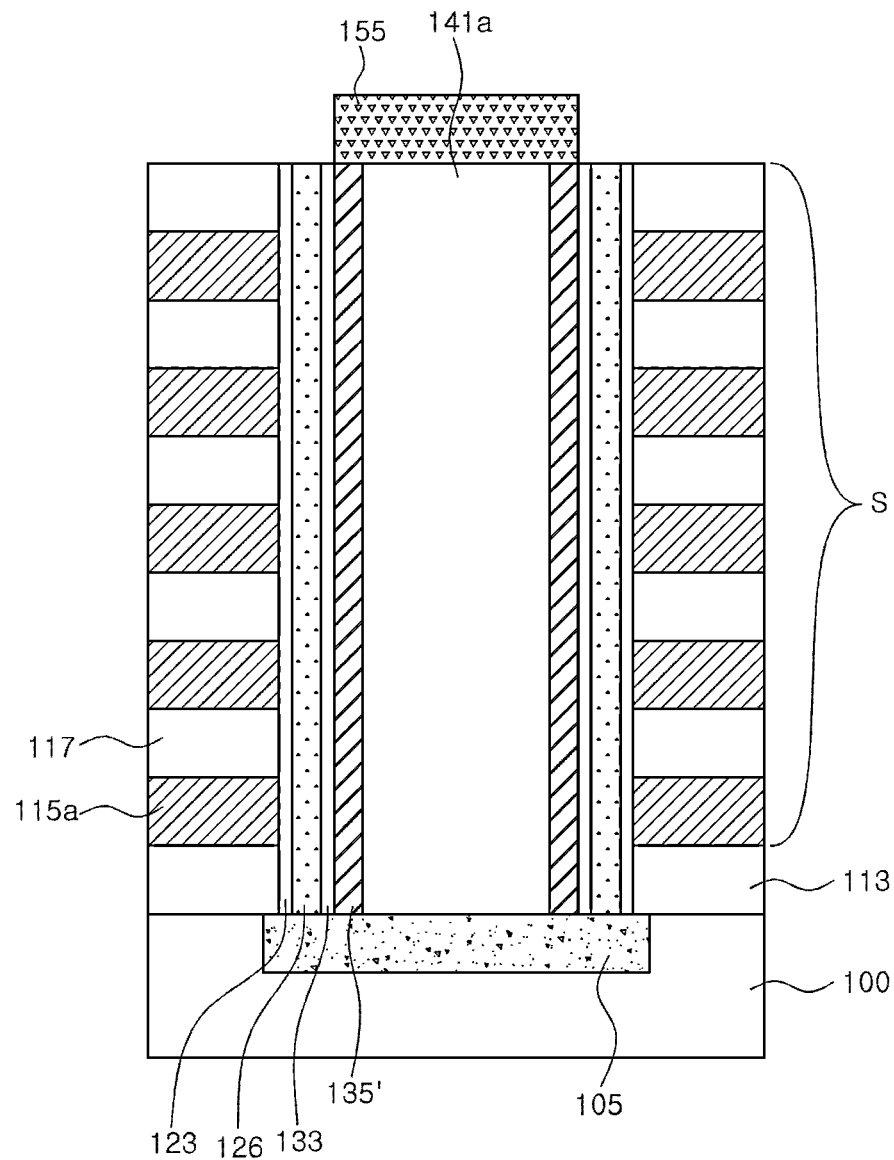

Referring to FIG. 5D, the opening H in which the metal oxide channel layer 135' is formed may be filled with a buried insulating film, and the buried insulating film is planarization etched to expose an upper surface of the stack S to form an insulating pillar 141a, and at the same time the upper surface of the insulating pillar 141a and the upper end of the metal oxide channel layer 135' surrounding the insulating pillar 141a may be exposed. An upper electrode 155 covering the insulating pillar 141a and the metal oxide channel layer 135' may be formed. The upper electrode 155 may be a bit line or a conductive pad connected to a bit line.

Referring back to FIG. 5D, the structure of the vertical non-volatile memory device according to the present embodiment will be described. The vertical non-volatile memory device according to the present exemplary embodiment may include an insulating pillar 141a extending in an upper direction of the substrate 100. Interlayer insulating layers 117 and control gate patterns 115a that are alternately stacked on the side of the insulating pillar 141a may be disposed. A metal oxide channel layer 135' stacked on the insulating pillar 141a between the insulating pillar 141a and the control gate patterns 115a and extending along the insulating pillar 141a may be positioned. Specifically, the side wall of the insulating pillar 141a may be surrounded by the metal oxide channel layer 135'. The metal oxide channel layer 135' may be polycrystalline including Bixbyite crystal grains or may be pseudo-monocrystalline in which Bixbyite crystals are preferentially oriented. A tunnel insulating layer 133, a charge trap layer 126, and a blocking insulating layer 123 are sequentially disposed between the metal oxide channel layer 135' and each of the control gate patterns 115a. The tunneling layer 133, the charge trap layer 126, and the blocking insulating layer 123 may be extended between the metal oxide channel layer 135' and the interlayer insulating layers 117. In other words, the metal oxide channel layer 135', the tunnel insulating layer 133, the charge trap layer 126, and the blocking insulating layer 123 may be sequentially wrapped around the sidewall of the insulating pillar 141a.

Hereinafter, a preferred experimental example is presented to help understanding of the present invention. However, the following experimental examples are only to aid the understanding of the present invention, and the present invention is not limited by the following experimental examples.

Preparation Examples 1-8: TFT Preparation

A p-type Si wafer was thermally oxidized to grow a 100 nm $SiO_2$ layer on the p-type Si wafer. On the $SiO_2$ layer, a 15 nm amorphous $I_{1-x}G_xO$ semiconductor pattern (see Table 1 below for the In and Ga content ratio) was deposited using RF sputtering in an argon atmosphere and a shadow mask. At this time, the RF power was 100 W and the chamber pressure was 3 mTorr. A shadow mask was placed on the semiconductor pattern and ITO (Indium Tin Oxide) was deposited using DC sputtering under an Ar atmosphere to form ITO source/drain electrodes on both ends of the semiconductor pattern. At this time, the DC power was 50 W and the operating pressure was 5 mTorr. The width of the semiconductor pattern was 1000 μm, and the length of the semiconductor pattern exposed between the source/drain electrodes was 300 μm. Thereafter, post-deposition annealing (PDA) was performed at 400° C. or 700° C. in an $O_2$ atmosphere for 1 hour. Samples having different content ratios of In and Ga were prepared and treated under different PDA temperatures as shown in Table 1 below.

Comparative Examples 1-4

TFTs were prepared in the same manner as in the Preparation Example, except that post-deposition annealing was not performed, and the content ratios of In and Ga in each example are shown in Table 1 below.

TABLE 1

| | $In_{1-x}G_xO$ | PDA temperature |
|---|---|---|
| Preparation Example 1 | $In_{0.59}G_{0.41}O$ (x = 0.41) | 400° C. |
| Preparation Example 2 | $In_{0.66}G_{0.34}O$ (x = 0.34) | 400° C. |
| Preparation Example 3 | $In_{0.75}G_{0.25}O$ (x = 0.25) | 400° C. |
| Preparation Example 4 | $In_{0.82}G_{0.18}O$ (x = 0.18) | 400° C. |
| Preparation Example 5 | $In_{0.59}G_{0.41}O$ (x = 0.41) | 700° C. |
| Preparation Example 6 | $In_{0.66}G_{0.34}O$ (x = 0.34) | 700° C. |
| Preparation Example 7 | $In_{0.75}G_{0.25}O$ (x = 0.25) | 700° C. |
| Preparation Example 8 | $In_{0.82}G_{0.18}O$ (x = 0.18) | 700° C. |
| Comparative Example 1 | $In_{0.59}G_{0.41}O$ (x = 0.41) | — |
| Comparative Example 2 | $In_{0.66}G_{0.34}O$ (x = 0.34) | — |
| Comparative Example 3 | $In_{0.75}G_{0.25}O$ (x = 0.25) | — |
| Comparative Example 4 | $In_{0.82}G_{0.18}O$ (x = 0.18) | — |

Figure 6A:
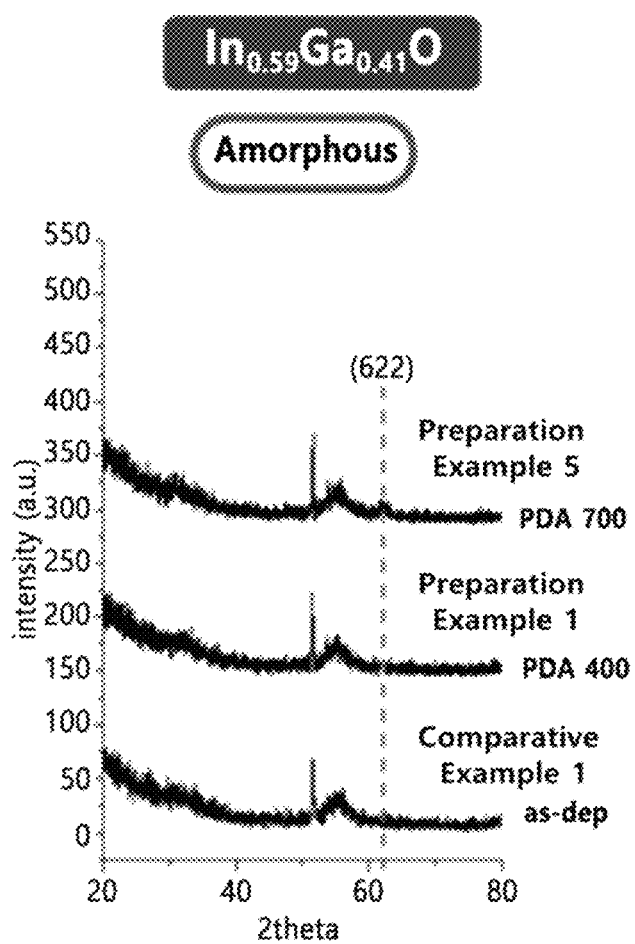
FIG. 6A shows X-ray diffraction (XRD) spectra for semiconductor layers of TFTs according to Preparation Example 1, Preparation Example 5, and Comparative Example 1.
Figure 6B:
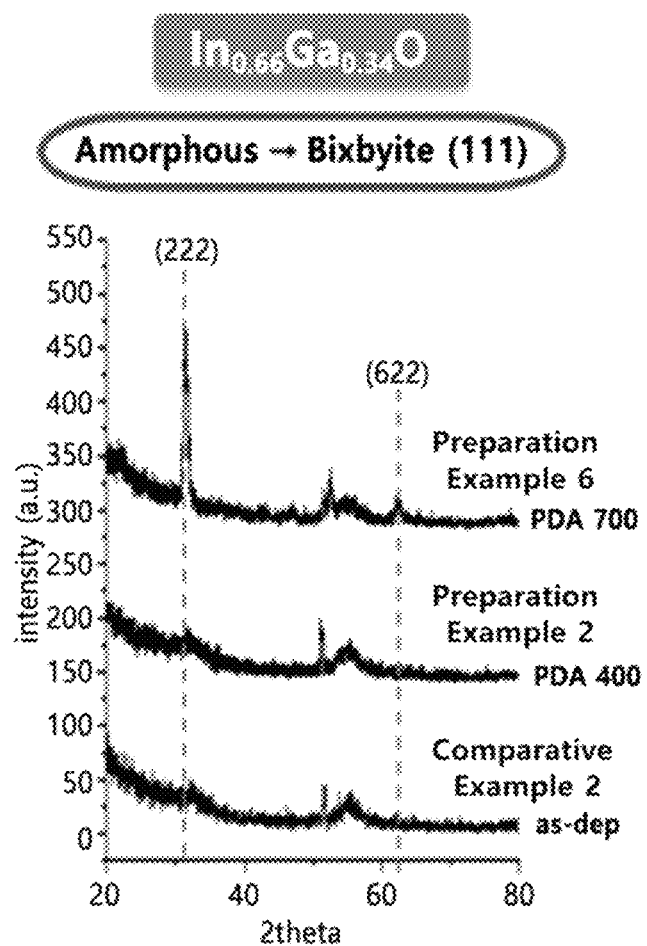
FIG. 6B shows XRD spectra for semiconductor layers of TFTs according to Preparation Example 2, Preparation Example 6, and Comparative Example 2.
Figure 6C:
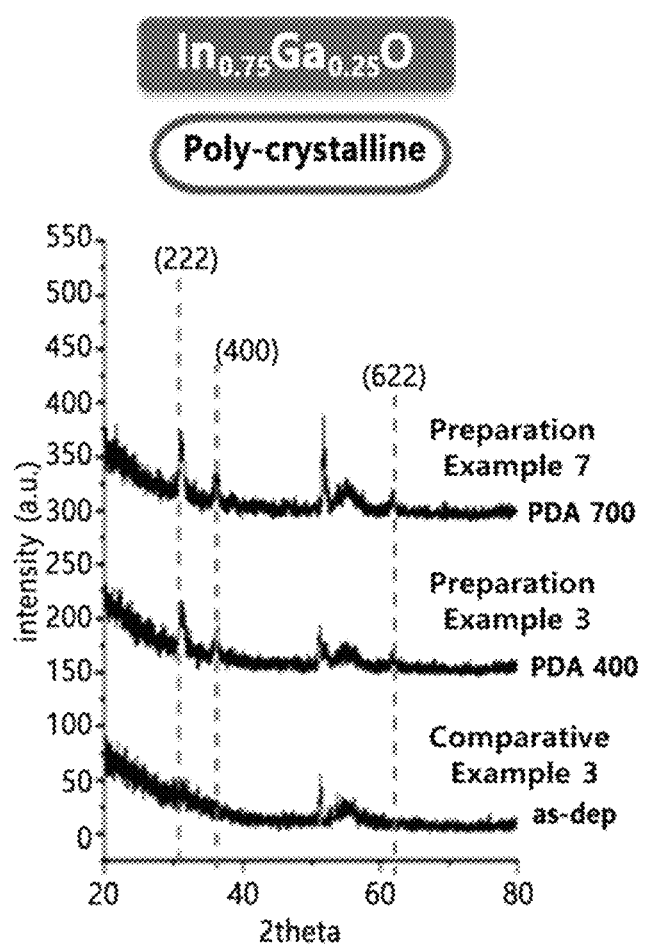
FIG. 6C shows XRD spectra for semiconductor layers of TFTs according to Preparation Example 3, Preparation Example 7, and Comparative Example 3.
Figure 6D:
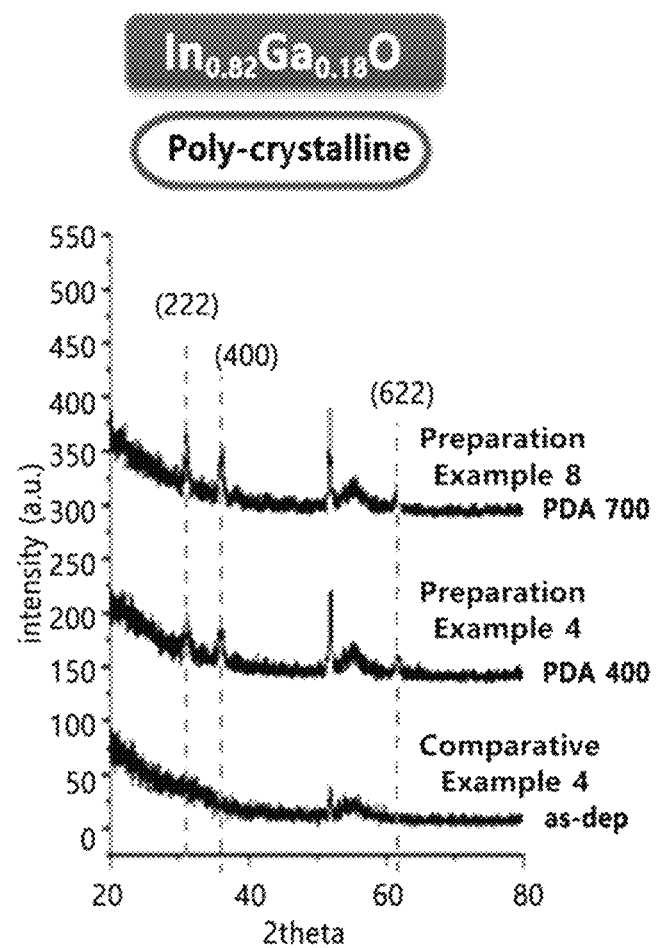
FIG. 6D shows XRD spectra for semiconductor layers of TFTs according to Preparation Example 4, Preparation Example 8, and Comparative Example 4.
Figure 7A:
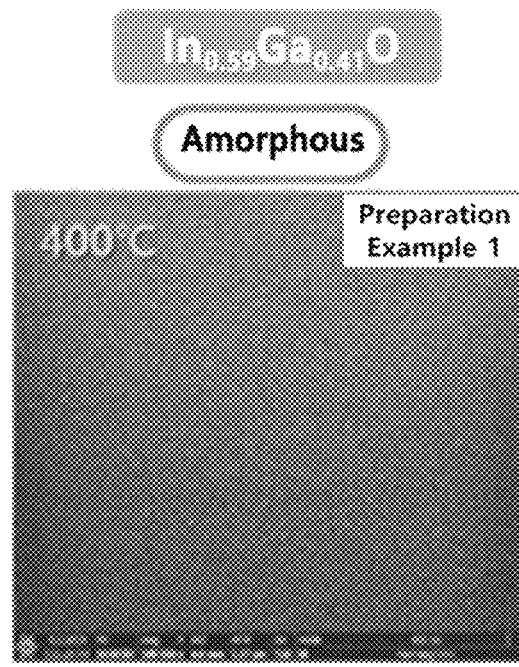
FIGS. 7A and 7B are SEM images of the semiconductor layers of the TFTs according to Preparation Examples 1 and 5, respectively.
Figure 7B:
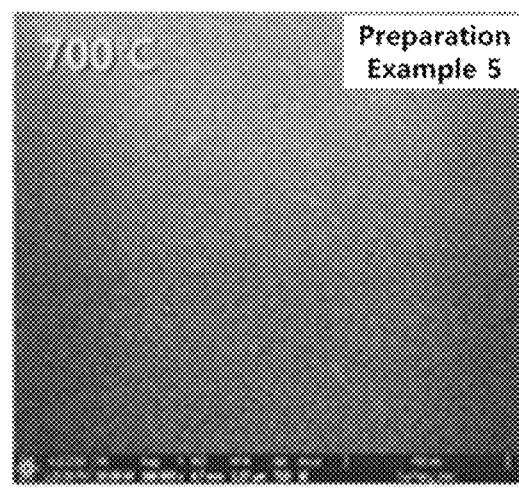
Figures 8A, 8B:
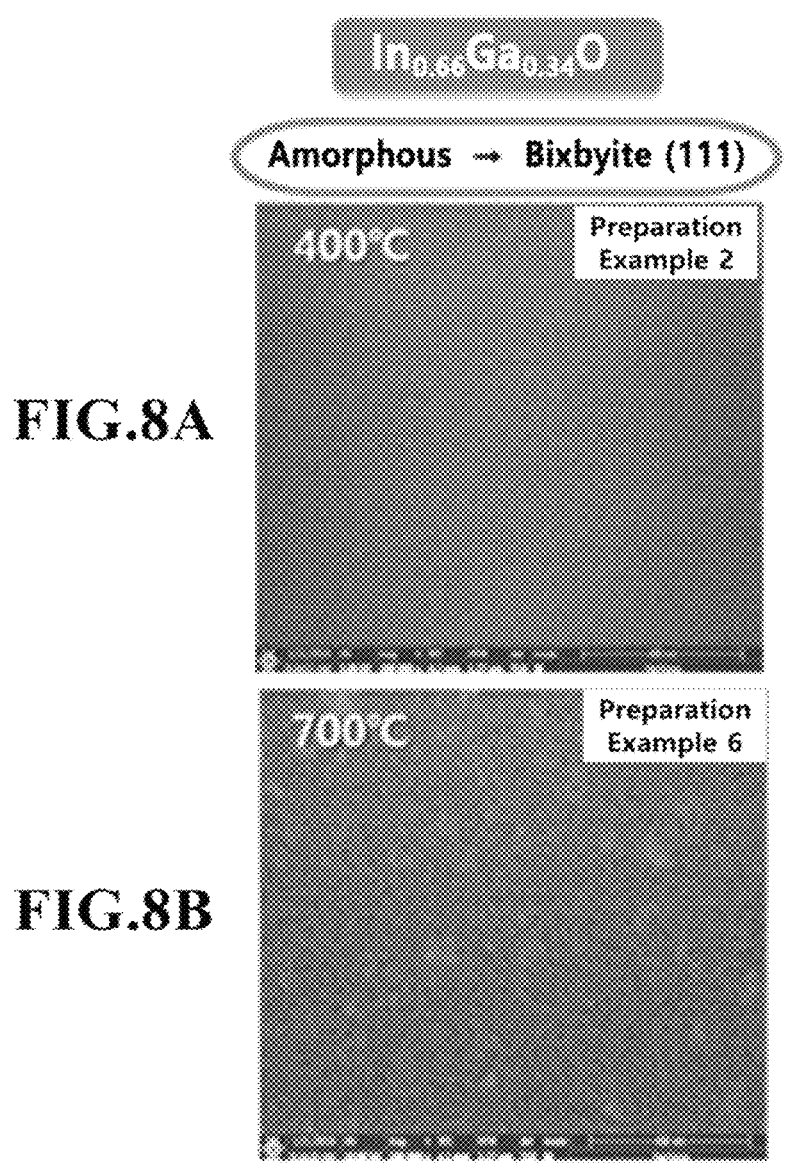
FIGS. 8A and 8B are SEM images of the semiconductor layers of the TFTs according to Preparation Examples 2 and 6, respectively.
Figure 9A:
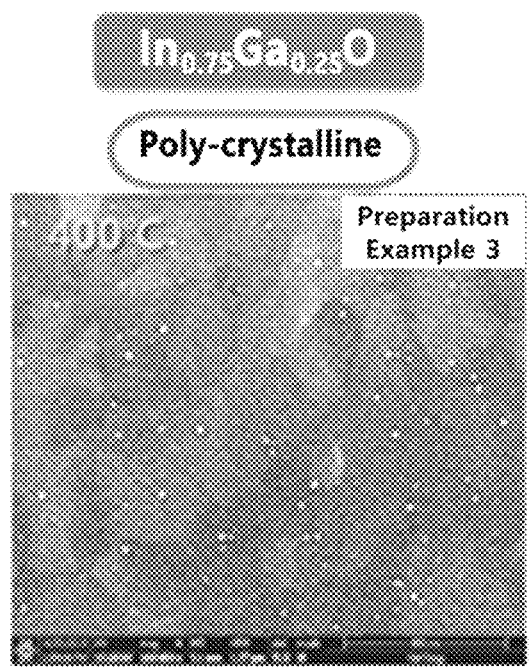
FIGS. 9A and 9B are SEM images of the semiconductor layers of the TFTs according to Preparation Examples 3 and 7, respectively.
Figure 9B:
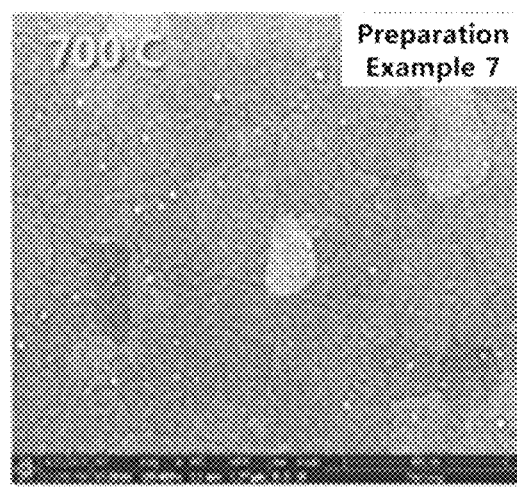
Figure 10A:
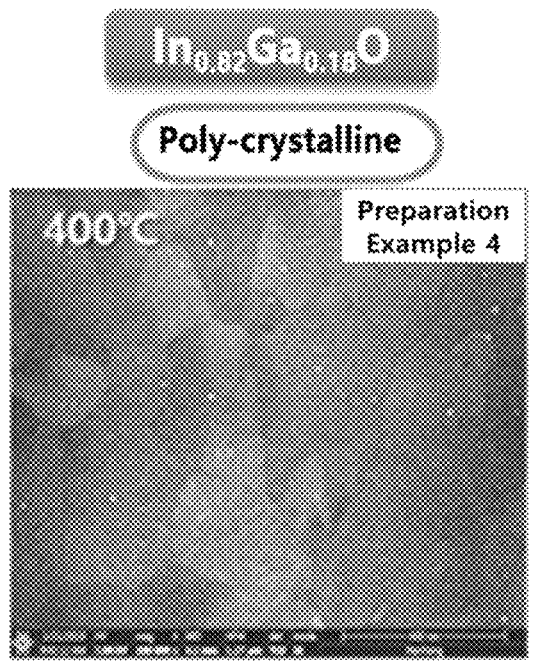
FIGS. 10A and 10B are SEM images of the semiconductor layers of the TFTs according to Preparation Examples 4 and 8, respectively.
Figure 10B:
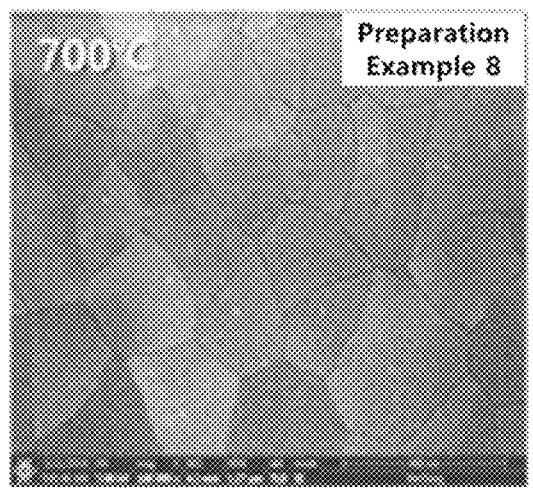

FIG. 6A shows X-ray diffraction (XRD) spectra for semiconductor layers of TFTs according to Preparation Example 1, Preparation Example 5, and Comparative Example 1, FIG. 6B shows XRD spectra for semiconductor layers of TFTs according to Preparation Example 2, Preparation Example 6, and Comparative Example 2, FIG. 6C shows XRD spectra for semiconductor layers of TFTs according to Preparation Example 3, Preparation Example 7, and Comparative Example 3, and FIG. 6D shows XRD spectra for semiconductor layers of TFTs according to Preparation Example 4, Preparation Example 8, and Comparative Example 4. FIGS. 7A and 7B are SEM images of the semiconductor layers of the TFTs according to Preparation Examples 1 and 5, respectively, FIGS. 8A and 8B are SEM images of the semiconductor layers of the TFTs according to Preparation Examples 2 and 6, respectively, FIGS. 9A and 9B are SEM images of the semiconductor layers of the TFTs according to Preparation Examples 3 and 7, respectively, and FIGS. 10A and 10B are SEM images of the semiconductor layers of the TFTs according to Preparation Examples 4 and 8, respectively. XRD analysis was performed using a step scan mode, with a step size (2θ) of 0.02°, 0.3 seconds per step, and Cu-Kα radiation (40 kV, 30 mA).

Referring to FIGS. 6A and 7, it can be seen that $In_{0.59}Ga_{0.41}O$ is amorphous in all the case where PDA is not carried out (Comparative Example 1) and where PDA is carried out at 400° C. and 700° C. (Preparation Example 1, Preparation Example 5). It can be seen that the peak intensity difference is small between the cases where the PDA does not proceed or the PDA temperature increases.

Referring to FIGS. 6B and 8, it can be seen that $In_{0.66}Ga_{0.34}O$ has an amorphous phase similar to $In_{0.59}Ga_{0.41}O$ when PDA is not processed (Comparative Example 2) and PDA is processed at 400° C. (Preparation Example 2). However, it can be seen that, when the PDA is operated at 700° C. (Preparation Example 6), a very large peak intensity corresponding to (222) at around 31° appears. This means that, when the $In_{0.66}Ga_{0.34}O$ thin film is heat-treated at 700° C., bixbyite crystals having {111} crystal planes in the thin film can be formed with preferential orientation. Considering the grain boundary is not found in FIG. 8, it is estimated that single-crystal-like crystallization is performed when the $In_{0.66}Ga_{0.34}O$ thin film is heat-treated at 700° C.

Referring to FIGS. 6C, 6D, 9, and 10, $In_{0.75}Ga_{0.25}O$ and $In_{0.82}Ga_{0.18}O$ show an amorphous phase when PDA is not carried out (Comparative Examples 3 and 4). In the case where PDA is proceeded at 400° C. or higher (Preparation Examples 3 and 7, and Preparation Examples 4 and 8), a peak corresponding to (400) at 36° in addition to a peak corresponding to (222) at 31° are shown. This means that when the $In_{0.75}Ga_{0.25}O$ thin film and the $In_{0.82}Ga_{0.18}O$ thin film are heat-treated at 400° C. or higher, polycrystalline structures containing bixbyite crystals having {111} crystal faces can be formed in these thin films, but {111} crystal faces are not preferentially oriented. In FIGS. 9 and 10, it can be seen that grains having relatively clear grain boundaries are generated. Also, it can be seen that the grain boundaries of the $In_{0.75}Ga_{0.25}O$ thin film and the $In_{0.82}Ga_{0.18}O$ thin film become clearer under the heat treatment conditions of 700° C. compared to 400° C. In addition, it can be seen that as the ratio of In increases, (222) peak intensity decreases, and (400) peak intensity increases. In addition, it can be seen that crystallization become difficult as the proportion of Ga increased.

Figure 11A:
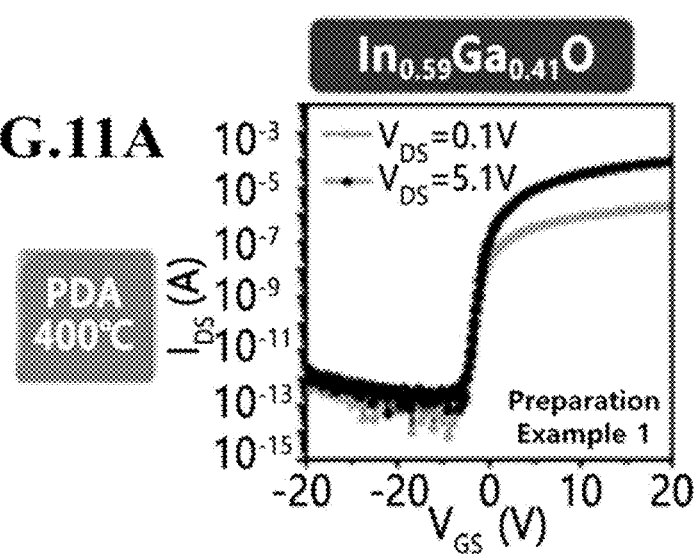
FIGS. 11A and 11B are graphs showing transfer characteristics ($I_{DS}$-$V_{GS}$) of TFTs according to Preparation Examples 1 and 5, respectively.
Figure 11B:
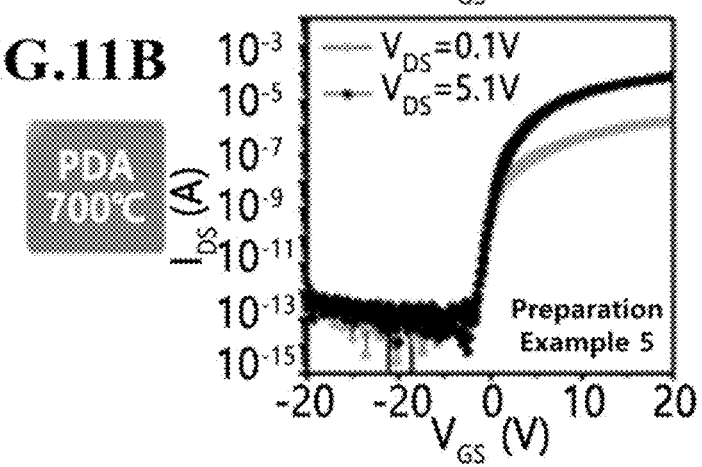
Figure 12A:
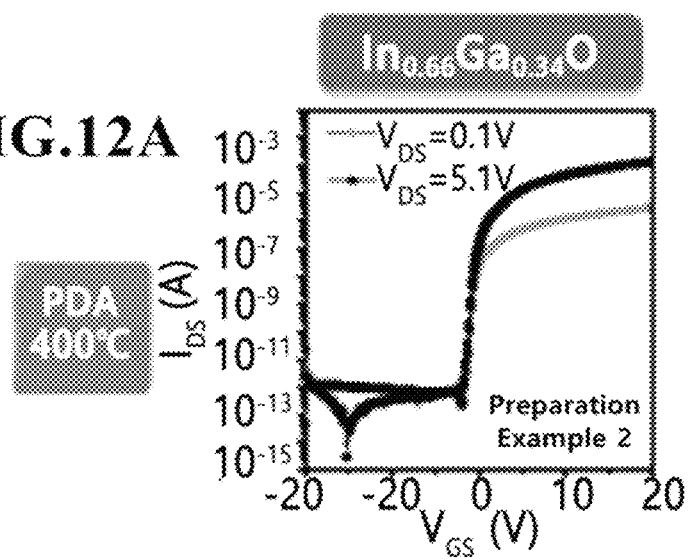
FIGS. 12A and 12B are graphs showing transfer characteristics ($I_{DS}$-$V_{GS}$) of TFTs according to Preparation Examples 2 and 6, respectively.
Figure 12B:
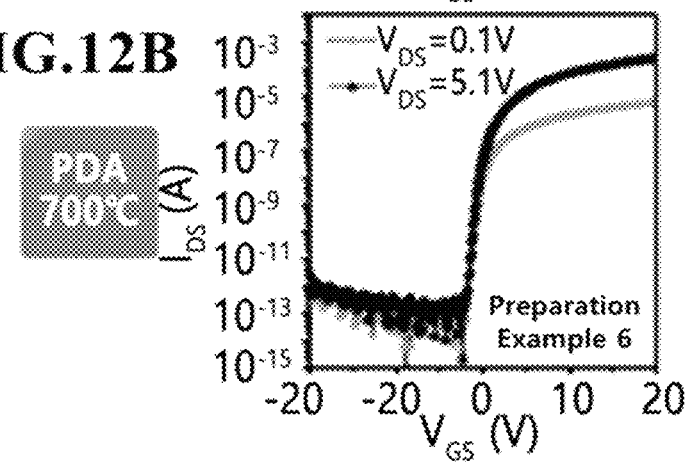
Figure 13A:
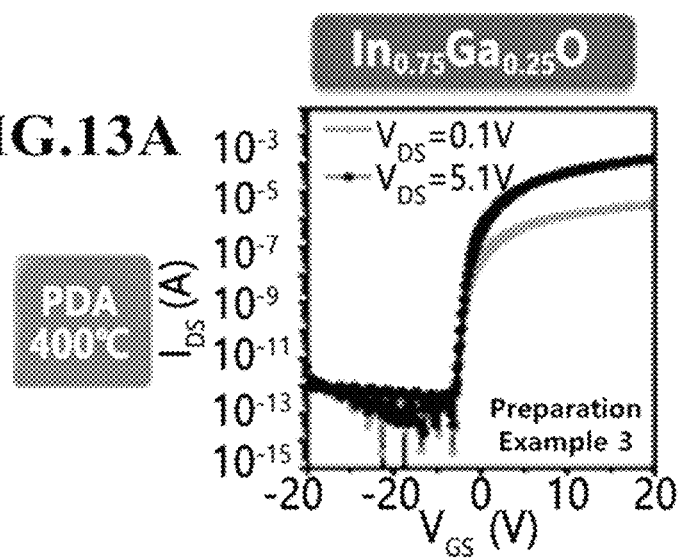
FIGS. 13A and 13B are graphs showing transfer characteristics ($I_{DS}$-$V_{GS}$) of TFTs according to Preparation Examples 3 and 7, respectively.
Figure 13B:
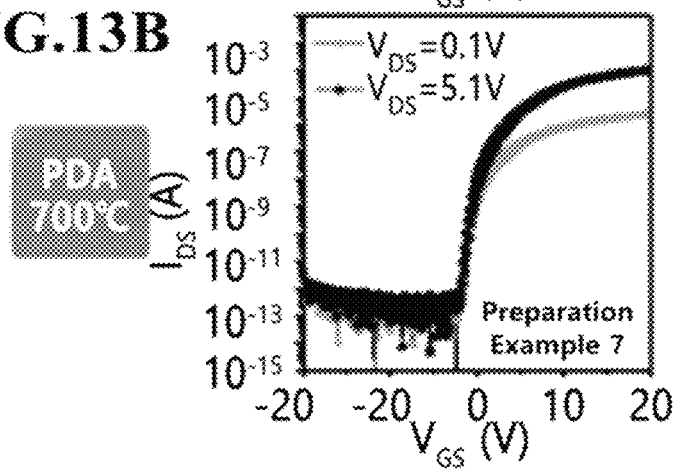
Figure 14A:
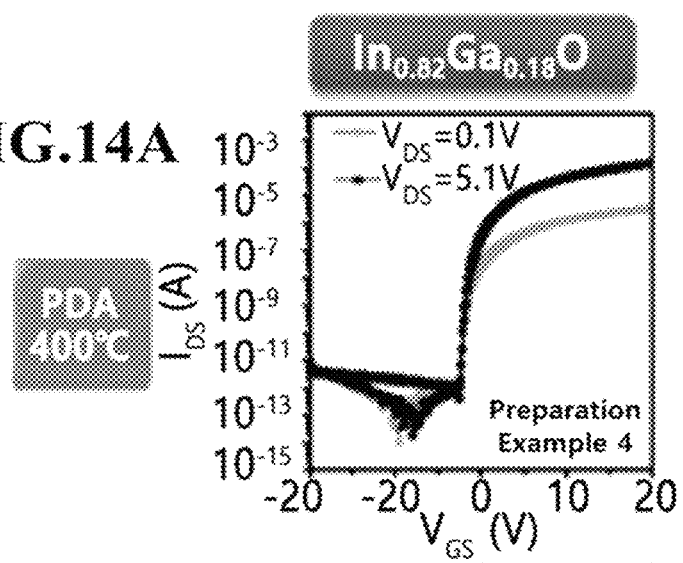
FIGS. 14A and 14B are graphs showing transfer characteristics ($I_{DS}$-$V_{GS}$) of TFTs according to Preparation Examples 4 and 8, respectively.
Figure 14B:
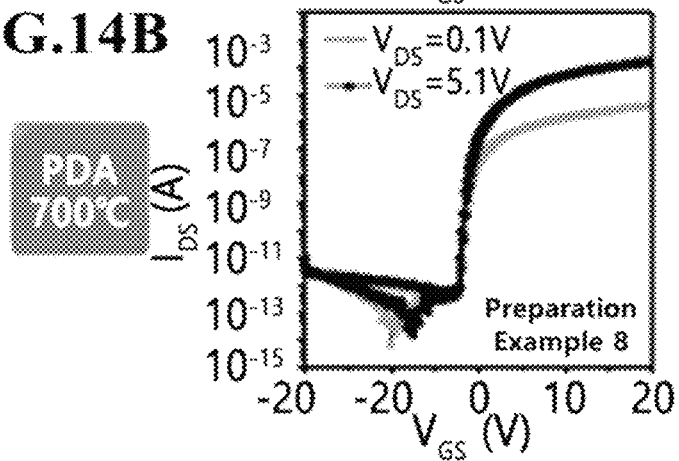

FIGS. 11A and 11B are graphs showing transfer characteristics ($I_{DS}$-$V_{GS}$) of TFTs according to Preparation Example 1 and Preparation Example 5, respectively. FIGS. 12A and 12B are graphs showing transfer characteristics ($I_{DS}$-$V_{GS}$) of TFTs according to Preparation Example 2 and Preparation Example 6, respectively. FIGS. 13A and 13B are graphs showing transfer characteristics ($I_{DS}$-$V_{GS}$) of TFTs according to Preparation Example 3 and Preparation Example 7, respectively. FIGS. 14A and 14B are graphs showing transfer characteristics ($I_{DS}$-$V_{GS}$) of TFTs according to Preparation Example 4 and Preparation Example 8, respectively.

In addition, Table 2 below shows the field-effect electron mobility ($\mu_{FE}$), the subthreshold swing (SS), and the threshold voltage ($V_{TH}$) of the TFTs according to Preparation Examples 1 to 8.

TABLE 2

| $In_{1-x}G_xO$ Preparation | $In_{0.59}G_{0.41}O$ (x = 0.41) | | $In_{0.66}G_{0.34}O$ (x = 0.34) | | $In_{0.75}G_{0.25}O$ (x = 0.25) | | $In_{0.82}G_{0.18}O$ (x = 0.18) | |
|---|---|---|---|---|---|---|---|---|
| Example # | 1 | 5 | 2 | 6 | 3 | 7 | 4 | 8 |
| PDA temperature (° C.) | 400 | 700 | 400 | 700 | 400 | 700 | 400 | 700 |
| $\mu_{FE}$ (cm²/Vs) (@ $V_{DS}$ = 0.1 V) | 18.68 | 21.87 | 27.96 | 60.67 | 34.61 | 27.01 | 44.38 | 40.33 |
| SS (V/decade) (@ $V_{DS}$ = 0.1 V) | 0.40 | 0.62 | 0.42 | 0.40 | 0.43 | 0.58 | 0.40 | 0.37 |
| $V_{TH}$(V) (@ $V_{DS}$ = 5.1 V) | −0.61 | 0.90 | −0.62 | −0.37 | −1.43 | 0.07 | −1.42 | −1.19 |

Referring to FIGS. 11 to 14, and Table 2, when the PDA proceeds at 400° C., it can be seen that, as In at % increases and Ga at % decreases, μFE increases and $V_{TH}$ shifts in the negative direction, but SS shows similar values. It can be seen that this is due to an increase in crystallinity according to an increase in In at % and a decrease in Ga at % when the PDA is proceeded at 400° C.

Meanwhile, when the PDA is proceeded at 700° C., μFE is increased compared to 400° C. when In is 59 to 66 at %, whereas when In is 75 to 82 at %, $V_{TH}$ shifts in the positive direction and μFE decreases compared to 400° C. despite the high In content. This is presumed to be due to that the grain boundary is firmly generated with increasing PDA temperature when In was 75 to 82 at. %.

In addition, when the PDA is proceeded at 700° C., it can be seen that, in case where In is 66 to 82 at %, μFE is almost the same or increases, SS is decreased, and $V_{TH}$ shifts in the negative direction compared to the case where In is 59 at %. This is presumed to be due to that Bixbyite crystals with {111} planes are formed when In was 66 to 82 at %. Furthermore, it can be seen that the $In_{0.66}Ga_{0.34}O$ channel layer has a very high μFE, a significantly low SS, and $V_{TH}$ greatly shifted in the negative direction compared to the channel layers with lower or higher In content ratio. It is presumed that the single crystal-like crystal structure is formed as the Bixbyite crystal having {111} plane is grown with preferential orientation in the $In_{0.66}Ga_{0.34}O$ channel layer.

While the exemplary embodiments of the present invention have been described above, those of ordinary skill in the art should understood that various changes, substitutions and alterations may be made herein without departing from the spirit and scope of the present invention as defined by the following claims.

The invention claimed is:

1. A thin film transistor comprising:
a gate electrode;
a metal oxide channel layer traversing the upper or lower portions of the gate electrode, wherein the metal oxide channel layer has semiconductor properties while having bixbyite crystals;
an insulating layer disposed between the gate electrode and the metal oxide channel layer; and
source and drain electrodes electrically connected to both ends of the metal oxide channel layer, respectively,
wherein the metal oxide channel layer is a pseudo-single crystal with a (222) diffraction peak without a (400) diffraction peak on an XRD spectrum.

2. The thin film transistor of claim 1, wherein the metal oxide channel layer is the pseudo-single crystal in which bixbyite crystal is preferentially oriented.

3. The thin film transistor of claim 1, wherein the metal oxide channel layer is an In—Ga oxide (IGO) layer having a content of 60 to 90 at % of In compared to the total number of atoms of In and Ga.

4. The thin film transistor of claim 1, wherein the metal oxide channel layer is an In—Ga oxide (IGO) layer having a content of 63 to 70 at % of In compared to the total number of atoms of In and Ga.

5. A vertical non-volatile memory device comprising:
a substrate:
an insulating pillar extending in an upper direction of the substrate;
interlayer insulating layers and control gate patterns disposed on the side of the insulating pillar and alternately stacked;
a metal oxide channel layer disposed on the insulating pillar and extending along the insulating pillar between the insulating pillar and the control gate patterns, wherein the metal oxide channel layer has semiconductor properties while having bixbyite crystals; and a tunnel insulating layer, a charge trap layer, and a blocking insulating layer sequentially disposed between the metal oxide channel layer and the control gate patterns, wherein the metal oxide channel layer is a pseudo-single crystal with a (222) diffraction peak without a (400) diffraction peak on an XRD spectrum.

6. The vertical non-volatile memory device of claim 5, wherein the metal oxide channel layer is the pseudo-single crystal in which bixbyite crystal is preferentially oriented.

7. The vertical non-volatile memory device of claim 5, wherein the metal oxide channel layer is an In—Ga oxide (IGO) layer having a content of 60 to 90 at % of In compared to the total number of atoms of In and Ga.

8. The vertical non-volatile memory device of claim 5, wherein the metal oxide channel layer is an In—Ga oxide (IGO) layer having a content of 63 to 70 at % of In compared to the total number of atoms of In and Ga.

9. A method for fabricating a thin film transistor comprising:

forming the thin film transistor including a gate electrode, a metal oxide channel layer traversing the upper or lower portions of the gate electrode, an insulating layer disposed between the gate electrode and the metal oxide channel layer, and source and drain electrodes electrically connected to both ends of the metal oxide channel layer, respectively, wherein the metal oxide channel layer is formed to contain In at about 60 to 90 at % of the total number of atoms of In and Ga, and is subjected to post-deposition annealing (PDA) at a temperature of 300 to 800° C., wherein the metal oxide channel layer is a pseudo-single crystal with a (222) diffraction peak without a (400) diffraction peak on an XRD spectrum.

10. The method of claim 9, wherein the metal oxide channel layer has semiconductor properties while having bixbyite crystals.

11. The method of claim 9, wherein the metal oxide channel layer is formed to contain In at about 63 to 70 at % of the total number of atoms of In and Ga, and is subjected to post-deposition annealing (PDA) at a temperature of 500 to 800° C.

12. The method of claim 11, wherein the metal oxide channel layer is formed to have the pseudo-single crystal in which bixbyite crystal is preferentially oriented.

* * * * *